(12) United States Patent
Uedaira

(10) Patent No.: US 11,662,462 B2
(45) Date of Patent: May 30, 2023

(54) PROXIMITY SENSOR FOR ALLEVIATING CROSSTALK AND ELECTRONIC DEVICE USING THE SAME

(71) Applicant: Rohm Co., Ltd., Kyoto (JP)

(72) Inventor: Yoshitsugu Uedaira, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 428 days.

(21) Appl. No.: 16/783,321

(22) Filed: Feb. 6, 2020

(65) Prior Publication Data

US 2020/0256990 A1 Aug. 13, 2020

(30) Foreign Application Priority Data

Feb. 12, 2019 (JP) .............................. JP2019-022276

(51) Int. Cl.
*G01S 17/04* (2020.01)
*G01V 8/12* (2006.01)
*G01S 17/08* (2006.01)
*H03K 17/945* (2006.01)

(52) U.S. Cl.
CPC .............. *G01S 17/04* (2020.01); *G01S 17/08* (2013.01); *G01V 8/12* (2013.01); *H03K 17/945* (2013.01)

(58) Field of Classification Search
CPC .......... G01S 17/04; G01S 17/06; G01S 17/46; G01S 17/08; G01S 7/48; G01V 8/12; G01V 8/14; H03K 17/945; H03K 2017/9455
USPC ................................................. 250/239, 221
See application file for complete search history.

(56) References Cited

U.S. PATENT DOCUMENTS 8,928,893 B2 * 1/2015 Findlay .................. H01L 31/125
257/E27.128
2012/0133956 A1 5/2012 Findlay et al.

FOREIGN PATENT DOCUMENTS

| JP | 2012-119448 | 6/2012 |
| JP | 2017-011120 | 1/2017 |
| KR | 10-1456971 | 11/2014 |

OTHER PUBLICATIONS

JP Office Action in Japanese Appln. No. 2019-022276, dated Dec. 6, 2022, 13 pages (with Machine Translation).
JP Search Report in Japanese Appln. No. 2019-022276, dated Dec. 6, 2022, 63 pages (with Machine Translation).
CN Office Action in Chinese Appln. No. 202010087036.3, dated Jan. 18, 2023, 16 pages (with Machine Translation).

* cited by examiner

*Primary Examiner* — Que Tan Le
(74) *Attorney, Agent, or Firm* — Fish & Richardson P.C.

(57) ABSTRACT

The present disclosure provides a proximity sensor. The proximity sensor includes: a substrate including a main surface; a light emitter and a light receiver disposed on the main surface; a resin disposed on the main surface, enclosing the light emitter and the light receiver, and including a boundary surface spaced apart from the main surface; a first crosstalk alleviator disposed on the boundary surface and including a first inclined surface; and a second crosstalk alleviator disposed on the boundary surface and including a second inclined surface.

36 Claims, 22 Drawing Sheets

PROXIMITY SENSOR FOR ALLEVIATING CROSSTALK AND ELECTRONIC DEVICE USING THE SAME

BACKGROUND OF THE INVENTION

Field of the Invention

The present disclosure relates to a proximity sensor and an electronic, device using the same.

Description of the Prior Art

A proximity sensor can be, for example, used to detect the presence of an object or the distance from a target object. The proximity sensor includes a light emitter and a light receiver which are disposed in a package structure. Light emitted from the light emitter is reflected off the target object, and the presence of the target object can be detected when the light receiver detects the reflection light. For example, an LED (light-emitting diode) or VCSEL (Vertical Cavity Surface Emitting Laser) can be utilized as a light emitter. To enhance the detection precision of the proximity sensor, it is necessary to alleviate crosstalk caused by scattered light or reflection light inside the proximity integrated in electronic device or package other than the reflection light off the target object. Moreover, the proximity sensor must be rendered compact and thin in order to comply with miniaturization and thinning requirements of the electronic device integrated with the proximity sensor.

Citation Document discloses a proximity sensor capable of alleviating crosstalk caused by reflection light or scattered light inside a package structure.

Regarding the proximity sensor disclosed in the aforementioned Document, a V-shaped groove, for example, is formed on the package structure, such that light emitted from a light emitter and reflecting off a boundary surface of the package structure does not propagate toward a light receiver. An inclined surface which defines the V-shaped groove enables light emitted from the light emitter to refract toward the outside of the package structure. Light which reflects off the inclined surface is altered toward directions not directed toward the light receiver. Therefore, the probability of the reflection of light emitted from the light emitter within the package structure being detected by the light receiver is reduced, and crosstalk can be alleviated.

However, crosstalk is not only caused by light reflecting within the package structure, but also caused by reflection light of an optical window (utilized to allow the emittance of the light emitted from the proximity sensor toward outside of the electronic device and the entrance of the reflection light from the target object toward the proximity sensor) of an electronic device integrated with the proximity sensor, or, collectively caused due to the reflection light of the optical window and the reflection light inside the package structure.

With regard to the proximity sensor disclosed in the same Document, the reflection light reflected at the optical window of the electronic device may reflect off a bottom substrate, which avoids the aforementioned V-shaped groove and thereby reach the surface of the package structure in the vicinity of the light receiver, wherein the cause of the crosstalk is that the light reflecting at the package surface reaches the light receiver.

PRIOR ART DOCUMENT

Citation Document

[Citation Document 1] Japan published patent application 2017-11120.

SUMMARY OF THE INVENTION

Problem to be Solved by Present Disclosure

The present disclosure is provided in view of the aforesaid drawback of the prior art. The objective of the present disclosure is to provide a proximity sensor capable of further alleviating crosstalk and an electronic device using the same proximity sensor.

Technical Means to Solve Problem

To solve the problem, the present disclosure adopts the technical means as described below.

A proximity sensor in the first aspect of the present disclosure includes: a substrate including a main surface; a light emitter and a light receiver disposed on the main surface; a resin disposed on the main surface, enclosing the light emitter and the light receiver, and including a boundary surface spaced apart from the main surface; a first crosstalk alleviator disposed on the boundary surface and including a first inclined surface; and a second crosstalk alleviator disposed on the boundary surface and including a second inclined surface.

In a preferred embodiment, wherein the first crosstalk alleviator is disposed between the light emitter and the light receiver, and the second crosstalk alleviator is closer to the light receiver comparing to the first crosstalk alleviator.

In a preferred embodiment, the boundary surface is flat and parallel to the main surface of the substrate except for portions disposed with the first crosstalk alleviator and the second crosstalk alleviator.

In a preferred embodiment, the first inclined surface and the second inclined surface incline away from the main surface of the substrate and toward the light emitter.

In a preferred embodiment, the first crosstalk alleviator is a first groove formed on the boundary surface and extending in a direction orthogonal to another direction which the light emitter and the light receiver are aligned along, and an inner surface of the first groove closer to the light emitter constitutes the first inclined surface.

In a preferred embodiment, the first inclined surface is flat and inclines from a bottom of the first groove to the boundary surface toward the light emitter.

In a preferred embodiment, the first groove has a V-shaped or inverted trapezoidal cross section profile.

In a preferred embodiment, the first inclined surface is curved and concave and slopes from a bottom of the first groove to the boundary surface toward the light emitter.

In a preferred embodiment, the first groove has a U-shaped or hemispherical cross section profile.

In a preferred embodiment, the first crosstalk alleviator is a first stripe formed on the boundary surface and extending in a direction orthogonal to another direction which the light emitter and the light receiver are aligned along, and a surface of the first stripe closer to the light receiver constitutes the first inclined surface.

In a preferred embodiment, the first inclined surface is flat and slopes from a top of the first stripe to the boundary surface toward the light receiver.

In a preferred embodiment, the first stripe has a triangular or trapezoidal cross section profile.

In a preferred embodiment, the first inclined surface is curved, convex and slopes from a top of the first stripe to the boundary surface toward the light receiver.

In a preferred embodiment, the first stripe has an inverted U-shaped or hemispherical cross section profile.

In a preferred embodiment, the second crosstalk alleviator is a second groove formed on the boundary surface and extending in a direction orthogonal to another direction which the light emitter and the light receiver are aligned along, and an inner surface of the second groove closer to the light emitter constitutes the second inclined surface.

In a preferred embodiment, the second inclined surface is flat and slopes from a bottom of the second groove to the boundary surface toward the light emitter.

In a preferred embodiment, the second groove has a V-shaped or inverted trapezoidal cross section profile.

In a preferred embodiment, the second inclined surface is curved, concave and slopes from a bottom of the second groove to the boundary surface toward the light emitter.

In a preferred embodiment, the second groove has a U-shaped or hemispherical cross section profile.

In a preferred embodiment, the second crosstalk alleviator is a second stripe formed on the boundary surface and extending in a direction orthogonal to another direction which the light emitter and the light receiver are aligned along, and a surface of the second stripe closer to the light receiver constitutes the second inclined surface.

In a preferred embodiment, the second inclined surface is flat and slopes from a top of the second stripe to the boundary surface toward the light receiver.

In a preferred embodiment, the second stripe has a triangular or trapezoidal cross section profile.

In a preferred embodiment, the second inclined surface is curved, convex and slopes from a top of the second stripe to the boundary surface toward the light receiver.

In a preferred embodiment, the second stripe has an inverted U-shaped or hemispherical cross section profile.

In a preferred embodiment, a reflection index alleviator is disposed on the main surface of the substrate and between the light emitter and the light receiver.

In a preferred embodiment, the reflection index alleviator absorbs light emitted from the light emitter.

In a preferred embodiment, the reflection index alleviator is a coating in a predetermined color.

In a preferred embodiment, the reflection index alleviator is tiny bumps and dents formed on the main surface.

In a preferred embodiment, the light emitter is VCSEL (Vertical Cavity Surface Emitting Laser).

In a preferred embodiment, the light emitter is LED (light-emitting diode).

In a preferred embodiment, the light receiver is a photodiode.

The electronic device in the second aspect of the present disclosure includes the proximity sensor in the first aspect of the present disclosure.

In a preferred embodiment, the electronic device includes an optical window permeable for light emitted from the proximity sensor and light reflecting off a target object to propagate toward the proximity sensor.

In a preferred embodiment, the proximity sensor is disposed in a manner that the boundary surface of the resin faces an inner side of the optical window, wherein a light-blocking film is disposed on the optical window at a position between an area corresponding to the light emitter and an area corresponding to the light receiver.

The other features and advantages of the present disclosure are described hereunder and depicted by the accompanying drawings.

FIC. 16 is a schematic view of the proximity sensor and electronic device according to the fifth embodiment of the present disclosure.

Figure 17:
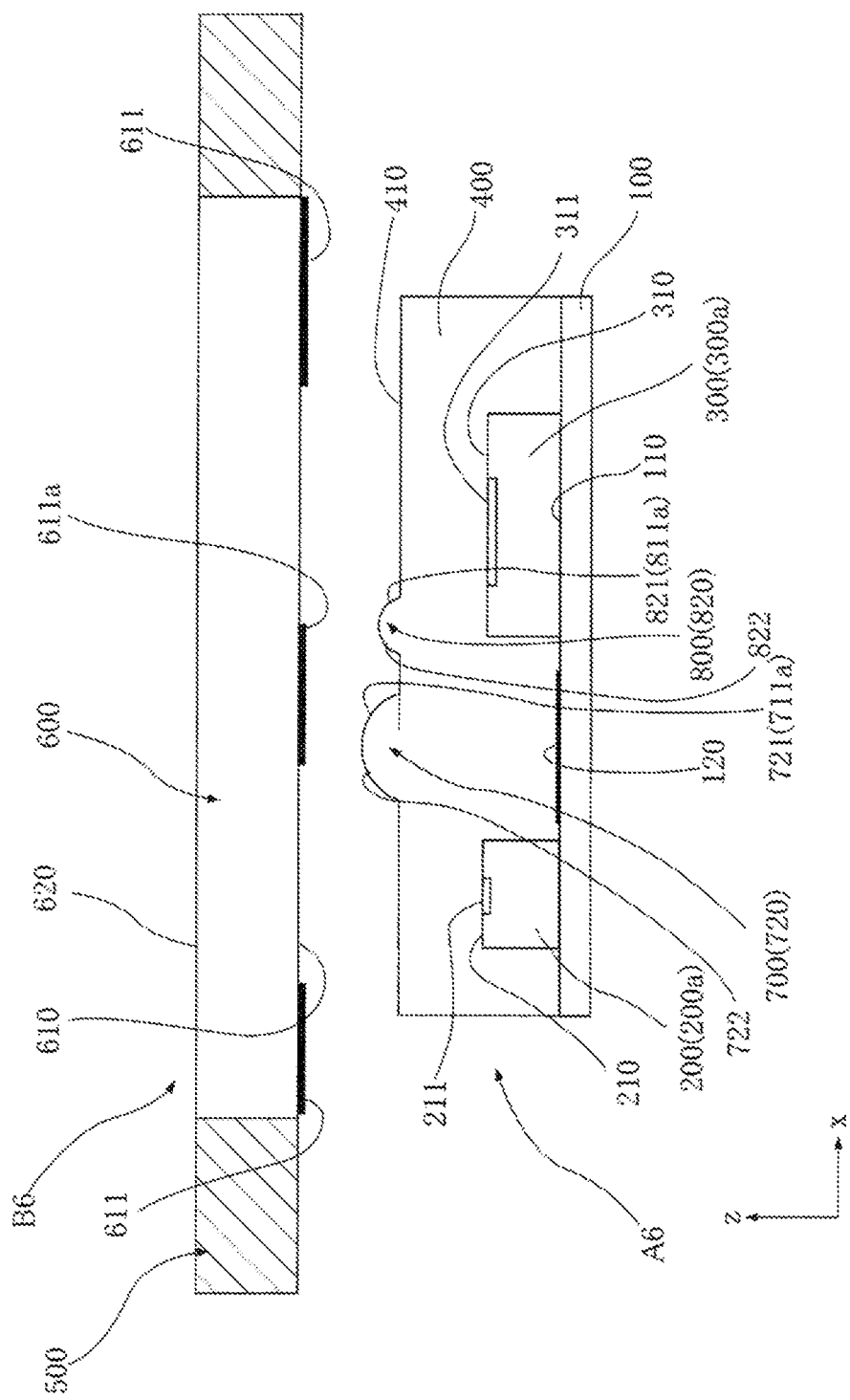

FIG. 17 is a schematic view of the proximity sensor and electronic device according to the sixth embodiment of the present disclosure.

Figure 18:
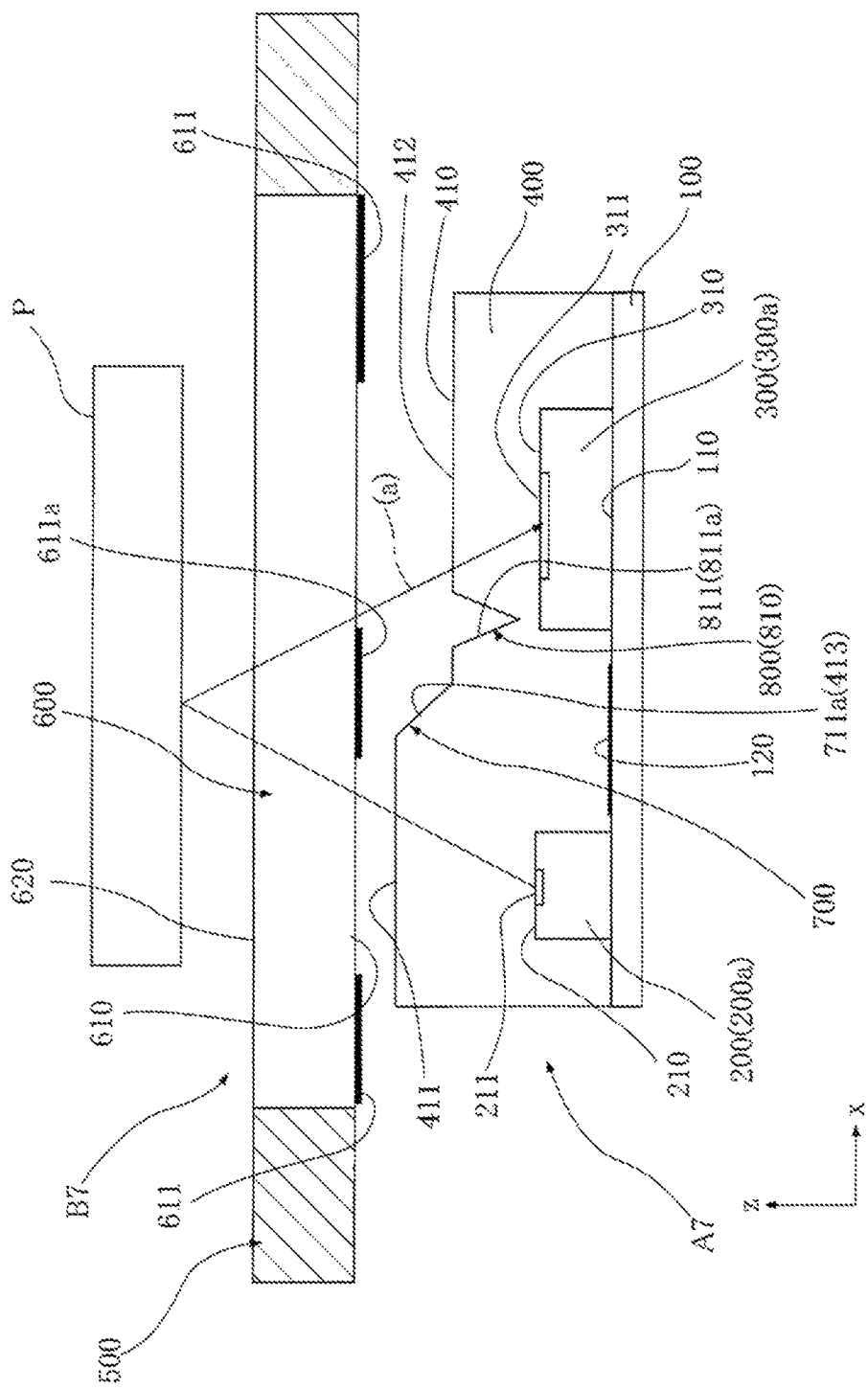

FIG. 18 is a schematic view of the proximity sensor and electronic device according to the seventh embodiment of the present disclosure.

Figure 19:
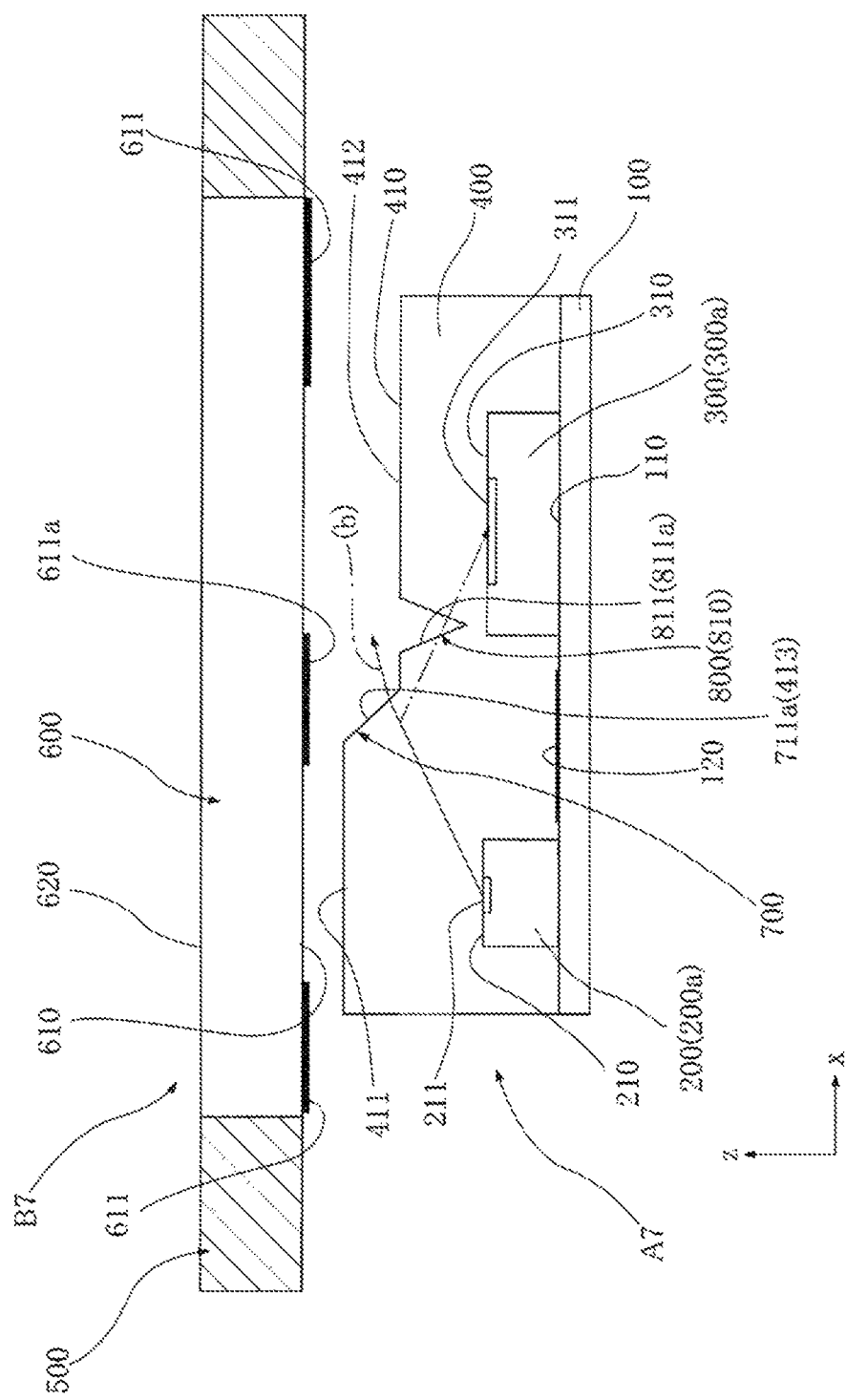

FIG. 19 is a diagram of the proximity sensor and electronic device shown in FIG. 18.

Figure 20:
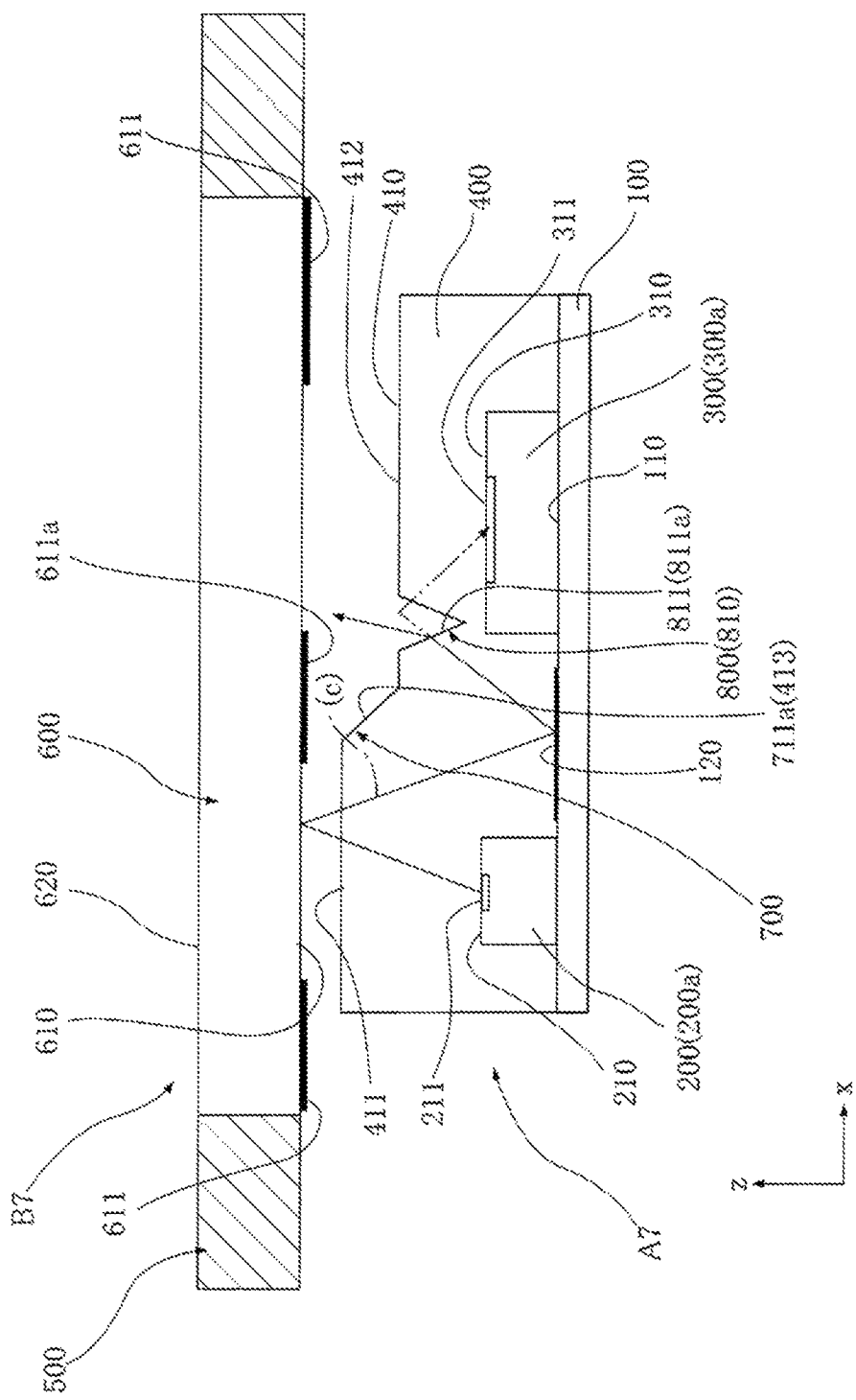

FIG. 20 is a diagram of the proximity sensor and electronic device shown in FIG. 18.

Figure 21:
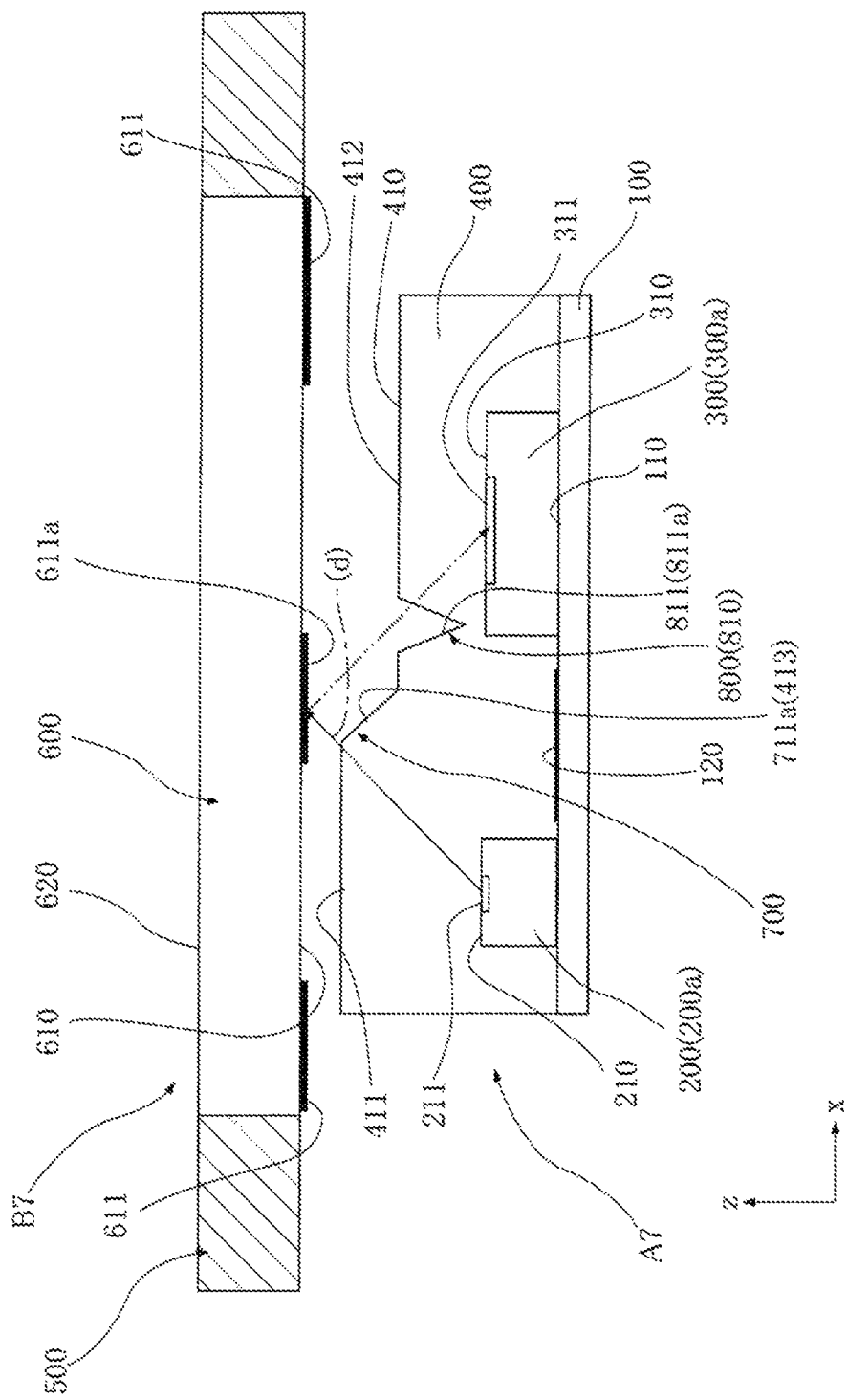

FIG. 21 is a diagram of the proximity sensor and electronic device shown in FIG. 18.

Figure 22:
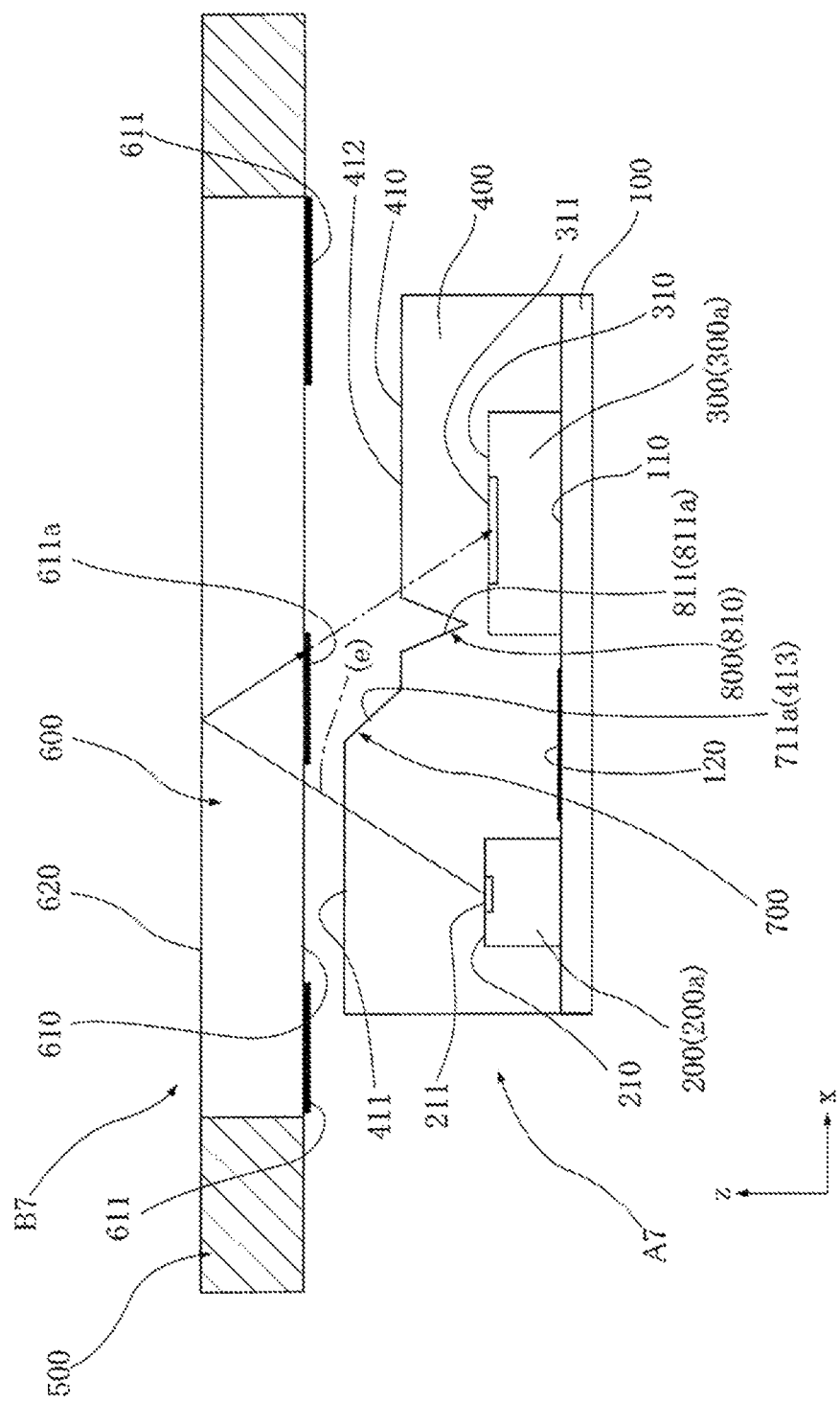

FIG. 22 is a diagram of the proximity sensor and electronic device shown in FIG. 18.

DETAILED DESCRIPTION OF THE EMBODIMENTS

Preferred embodiments of the present disclosure are hereunder described in detail in conjunction with accompanying drawings, FIG. 1~FIG. 8 show a proximity sensor A1 and an electronic device B1 using the same proximity sensor according to the first embodiment of the present disclosure.

The proximity sensor A1 includes a substrate 100, a light emitter 200 and a light receiver disposed on the substrate 100, and a resin 400 disposed on a main surface 110 (upper surface in FIG. 1) of the substrate 100 and enclosing the light emitter 200 and the light receiver 300. The electronic device includes a housing 500 and an optical window 600. For the sake of illustration, the direction in which the light emitter 200 and the light receiver 300 are aligned with each other is denoted as x-direction, the direction perpendicular to x-direction denoted as y-direction, and the direction normal to x-y plane is denoted as z-direction.

The substrate 100 is, for example, a rigid substrate made of ceramic or hard resin, such as glass epoxy resin, or a flexible substrate made of a soft material, such as polyimide. The substrate 100 has a main surface 110 at the upper side. The substrate 100 is a cuboid with an x-direction dimension longer than a y-direction dimension. For example, the substrate 100 has an x-direction dimension of 3 mm, a y-direction dimension of 1.6 mm, and a z-direction (thickness) dimension of 100 μm in the case of a rigid substrate or 50 μm in the case of a flexible substrate, but the present disclosure is not limited thereto. A reflection index alleviator 120 is disposed between the light emitter 200 and the light receiver 300 on the main surface 110 of the substrate 100.

The light emitter 200 is bonded on the main surface 110 of the substrate 100 and positioned on one side of x-direction of the main surface 110 while at a center line along x-direction axis of the main surface 110. The light emitter 200 is, for example, VCSEL ((Vertical Cavity Surface Emitting Laser) 200a. The VCSEL 200a is cuboidal and has a predetermined thickness dimension. For example, the VCSEL 200a has planar dimensions of 250 μm×250 μm and a thickness dimension of 150 μm, but the present disclosure is not limited thereto. The VCSEL 200a is bonded to the substrate 100 in the manner of having its light-emitting surface 210 facing upward and its lateral side 220 being parallel to an edge 130 of the substrate 100. The light-emitting surface 210 of the VCSEL 200a is parallel to the main surface 110 of the substrate 100. A light-emitting portion 211 is disposed at a center portion of the light-emitting surface 210.

The light receiver 300 is bonded on the main surface 110 of the substrate 100 at the other side along x direction, that is, positioned along x direction and spacing apart from the light emitter 200 while at a center line CL along x-direction axis of the main surface 110. The light receiver 300 is, for example, a photodiode 300a integrated into an LSI (Large Scale Integration). The photodiode 300a is cuboidal as a whole and has a predetermined thickness dimension. For example, the LSI including the photodiode 300a has planar dimensions of 300 μm×100 μm and a thickness dimension of 230 μm, but the present disclosure is not limited thereto. The photodiode 300a is mounted on the substrate 100 in the manner of having its light-receiving surface 310 facing upward and a lateral side 320 of the LSI being parallel to the edge 130 of the substrate 100. The light-receiving surface 310 of the photodiode 300a is parallel to the main surface 110 of the substrate 100. The distance between the VCSEL 200a and the photodiode 300a is, for example, 1000~2000 μm, but the present disclosure is not limited thereto. A light-receiving portion 311 is disposed at a center portion of the light-receiving surface 310.

The resin 400 is configured to protect the VCSEL 200a and the photodiode 300a from moisture, humid surroundings, contamination and collisions. The resin 400 is formed on the main surface 110 of the substrate 100 and enclosing the VCSEL 200a and the photodiode 300a. The resin 400 has the same rectangular surfaces as the substrate 100 and a predetermined thickness. The upper surface of the resin 400 is defined as a boundary surface 410. Except the part where a first crosstalk alleviator 700 and a second crosstalk alleviator 800 are disposed, the remaining part of the boundary surface 410 is flat and parallel to the main surface 110 of the substrate 100. The resin 400 has the same planar dimensions as the substrate 100, for example, 3 mm×1.6 mm, in this embodiment. For example, the resin 400 has a thickness dimension of 500 μm, but the present disclosure is not limited thereto. Consequently, for example, the proximity sensor A1 has a thickness dimension of 600 μm. The resin 400 is made of light-transmissive resin and thus permeable by light emitted from the VCSEL 200a. The light-permeable resin is, for example, transparent or translucent resin. The resin is, for example, epoxy resin, silicone resin, polyimide resin, acrylic resin, and urea resin.

The optical window 600 is formed within an appropriate area of the housing 500 of the electronic device B1. The proximity sensor A1 is disposed on the inner side of the optical window 600 in a manner that the boundary surface 410 of the resin 400 is parallel to the optical window 600. The optical window 600 is, for example, made of light-permeable resin. The other technical features of the optical window 600 are described later.

The first crosstalk alleviator 700 and the second crosstalk alleviator 800 are disposed on the boundary surface 410 of the resin 400, as will be further described subsequently.

Regarding the proximity sensor Ain this embodiment, the first crosstalk alleviator 700 is disposed between the VCSEL 200a and the photodiode 300a, wherein the first crosstalk alleviator 700 is a first groove 710 formed on the boundary surface 410, and has a V-shaped cross section (cross sectional triangular profile) extending along the y-direction uniformly. The first groove 710 has a flat inner surface 711. The flat inner surface 711 slopes upward (i.e., in the direction from the bottom of the first groove 710 to the boundary surface 410) toward the side of the VCSEL 200a. The flat inner surface 711 is also deemed as a first inclined surface 711a, The first groove 710 further has a flat inner surface 712. The flat inner surface 712 slopes upward (i.e., in the direction from the bottom of the first groove 710 to the boundary surface 410) toward the side of the photodiode 300a. The depth of the first groove 710 is preferably at least ½ of the thickness of the resin 400. Moreover, an angle between the two inner surfaces 711, 712 which define the first groove 710 can be set according to the distance between the light-emitting surface 210 of the VCSEL 200a and the boundary surface 410 of the resin 400, the distance between the boundary surface 410 and an inner surface 610 of the optical window 600, the thickness of the optical window 600, the distance between the VCSEL 200a and the photodiode 300a, and the distance between the light-receiving surface 310 of the photodiode 300a and the boundary surface 410 of the resin 400. For example, the degree can be set between 20~50 degrees.

Regarding the proximity sensor A1 in this embodiment, the second crosstalk alleviator 800, which is not only apart from the first groove 710 and positioned at a side toward to the photodiode 300a in the x-direction but also apart from the light-receiving portion 311 of the photodiode 300a and at a side toward the VCSEL 200a in the x-direction, and the second crosstalk alleviator 800 is a second groove 810. The second groove 810 is formed on the boundary surface 410, has a V-shaped cross section (cross sectional triangular profile), and extends in the y-direction uniformly. The second groove 810 has a flat inner surface 811. The flat inner surface 811 slopes upward (i.e., in the direction from the bottom of the second groove 810 to the boundary surface 410) toward the side of the VCSEL 200*a*. The flat inner surface 811 is also deemed as a second inclined surface 811*a*. The second groove 810 further has a flat inner surface 812. The flat inner surface 812 slopes upward (i.e., in the direction from the bottom of the second groove 810 to the boundary surface 410) toward the side of the photodiode 300*a*. The depth of the second groove 810 is preferably less than ½ of the thickness of the resin 400. Moreover, the angle between the two inner surfaces 811, 812 which define the second groove 810 can be set according to the distance between the light-emitting surface 210 of the VCSEL 200*a* and the boundary surface 410 of the resin 400, the distance between the boundary surface 410 and the inner surface 610 of the optical window 600, the thickness of the optical window 600, the distance between the VCSEL 200*a* and the photodiode 300*a*, and the distance between the light-receiving surface 310 of the photodiode 300*a* and the boundary surface 410 of the resin 400. For example, the angle can be set as 60~100 degrees The optical window 600 of the electronic device B1 is spaced apart from the boundary surface 410 of the resin 400 of the proximity sensor A1 by a predetermined distance. The spaced-apart distance is, for example, 0.2~0.5 mm, but the present disclosure is not limited thereto. The optical window 600 is provided in the form of a light-permeable resin which has the inner surface 610 and an outer surface 620 and may have a thickness, for example, of 0.5~1.0 mm, but the present disclosure is not limited thereto. A light-blocking film 611 is formed on the inner surface 610 of the optical window 600 and adapted to block light emitted from the VCSEL 200*a*. The light emitted from the VCSEL 200*a* passes through the optical window 600 from the inner surface 610 of the optical window 600, then undergoes internal reflection on the outer surface 620, and is finally emitted from the inner surface 610 to propagate toward the light-receiving surface 310 of the photodiode 300*a*, thereby causing crosstalk. The light-blocking film 611 is configured to shield the aforementioned light that can be a reason of causing crosstalk. The light-blocking film 611 has an area 611*a* capable of shielding light. The area 611*a* of the light-blocking film 611 lies in a specific region of the inner surface of the optical window 600 and is positioned between the VCSEL 200*a* and the photodiode 300*a* when viewed from above (in plain view). When viewed from above, in this embodiment illustrated by FIG. 3, the region other than a round light-permeable region 612 corresponding in position to the VCSEL 200*a* and a round light-permeable region 613 corresponding in position to the photodiode 300*a* is configured to be a light-blocking region, and the area 611*a* (Which lies between the two light-permeable regions 612, 613) of the light-blocking region is configured to be capable of blocking light in order to preclude crosstalk. The light-blocking film 611 can be formed by, for example, a black coating, The reflection index alleviator 120 is disposed on the main surface 110 of the substrate 100. The reflection index alleviator 120 is disposed on the main surface 110 of the substrate 100 and positioned between the VCSEL 200*a* and the photodiode 300*a*. In this embodiment, the reflection index alleviator 120 correspondingly overlaps with the first crosstalk alleviator 700 (which is the first groove 710 in this embodiment) from a plain view. For example, the reflection index alleviator 120 incudes a black coo ting or tiny bumps and dents capable of absorbing the light emitted from the VCSEL 200*a*.

Functions of the proximity sensor A1 and the electronic device B1 in this embodiment are described below.

Figure 1:
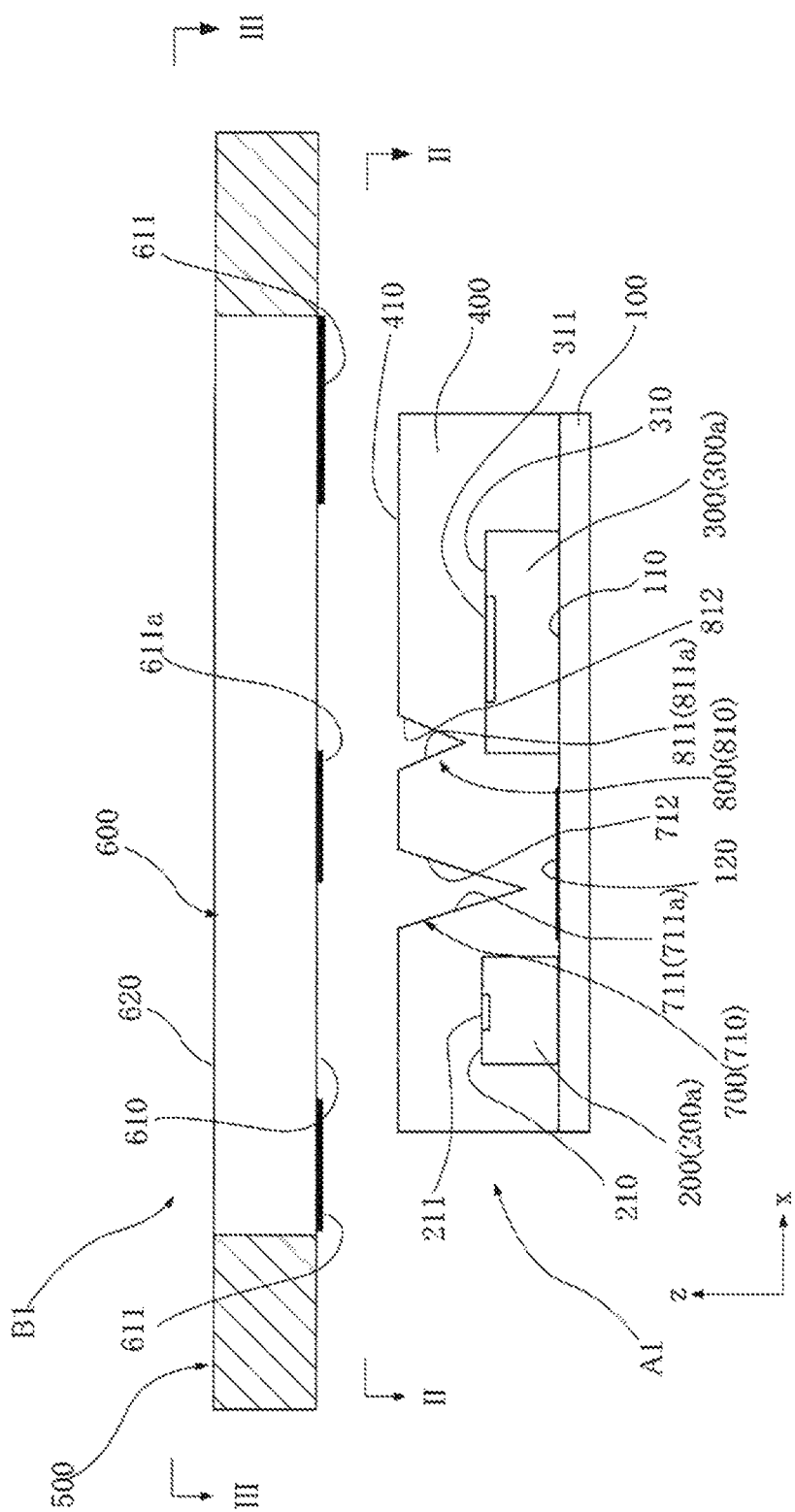
FIG. 1 is a schematic view of a proximity sensor and an electronic device according to the first embodiment of the present disclosure.
Figure 2:
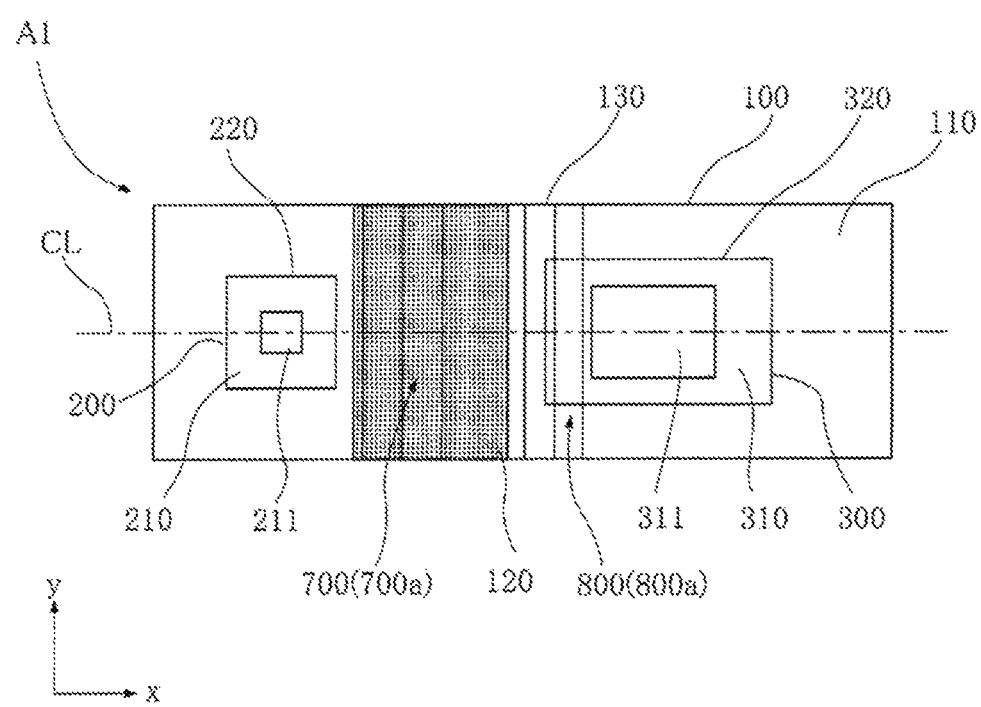
FIG. 2 is a cross-sectional view taken along line II-II of FIG. 1.
Figure 3:
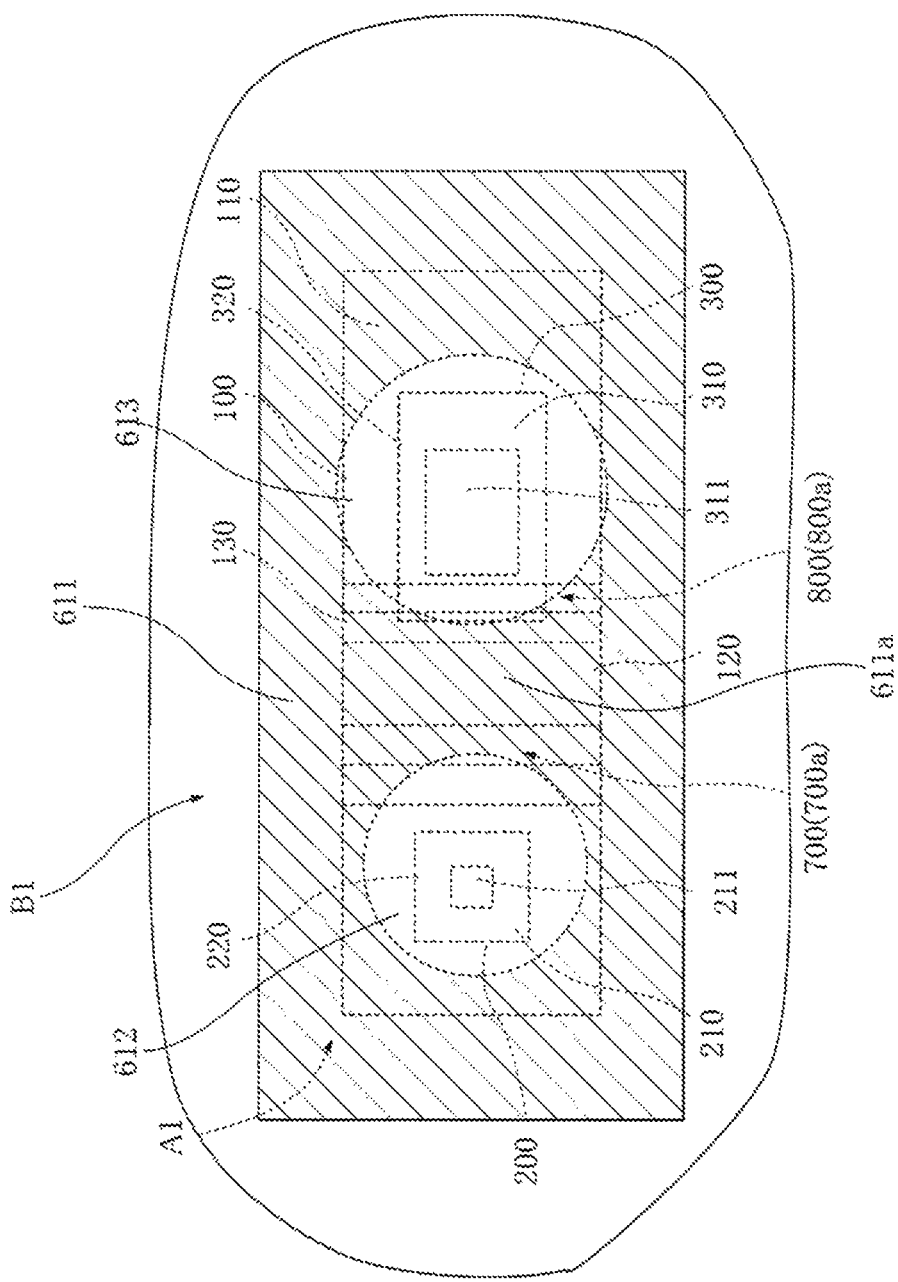
FIG. 3 is a cross-sectional view taken along line III-III of FIG. 1.
Figure 4:
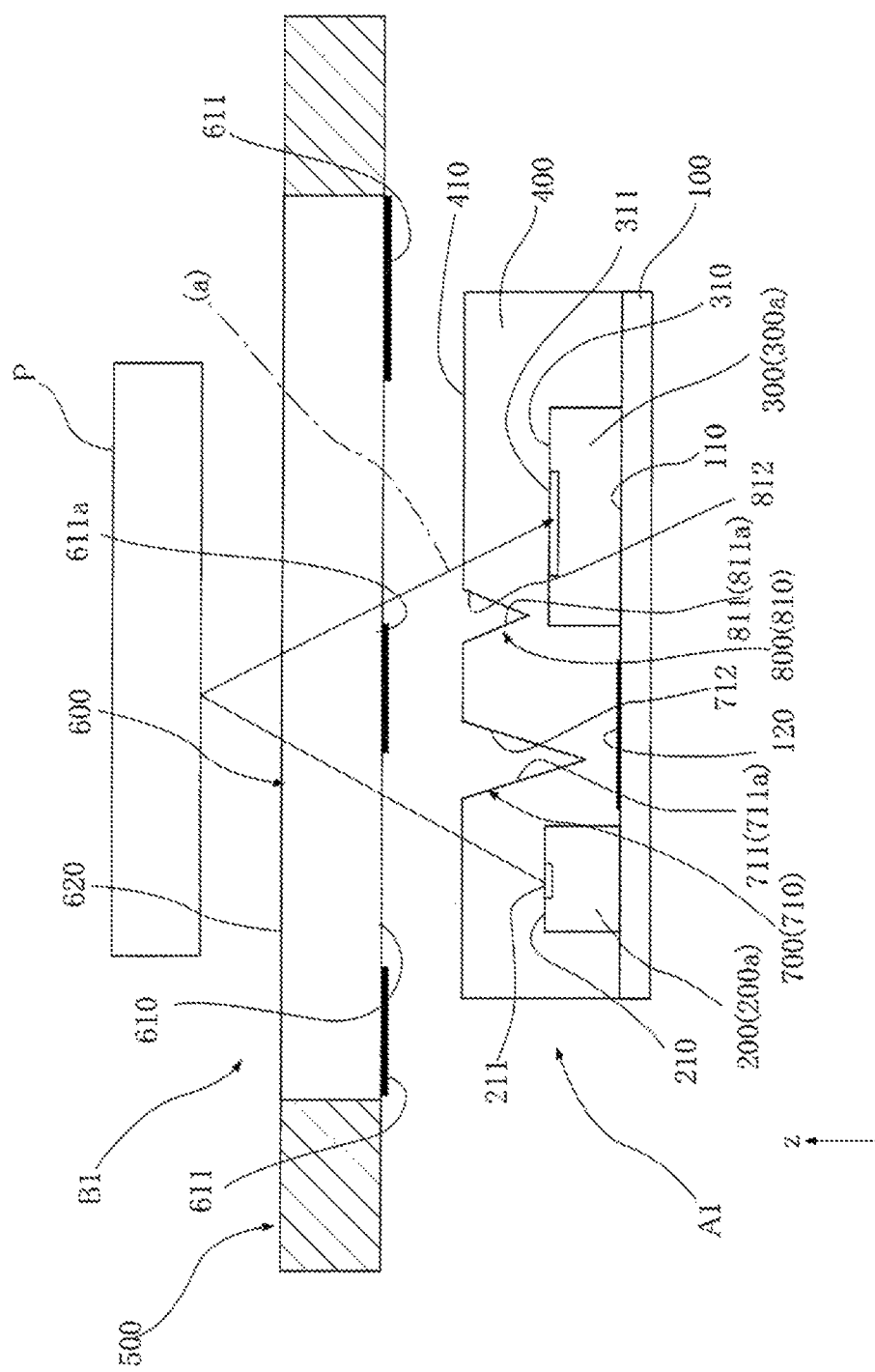
FIG. 4 is a diagram of the proximity sensor and electronic device shown FIG. 1.

The presence of a target object P is detected and determined according to whether the light emitted from the VCSEL 200*a* propagates and reaches the light-receiving portion 311 of the photodiode 300*a* by following the path indicated by (a) in FIG. 4, that is, from the VCSEL 200*a* propagates, sequentially passing the boundary surface 410 of the resin 400, then passing the inner and outer surfaces 610, 620 of the optical window 600, and finally reaching the outside of the electronic device B1. When the target object P is present, the emitted light reflects off the surface of the target object P, then passes the inner and outer surfaces 610, 620 of the optical window 600 and the boundary surface 410 of the resin 400, and finally reaches the light-receiving portion 311 of the photodiode 300*a*. The light-blocking film 611 disposed on the inner surface 610 of the optical window 600 does not block the reflection light path which starts at the target object P and ends at the light-receiving portion 311 of the photodiode 300*a*. When the target object P is absent, the photodiode 300*a* does not receive the reflection light from the target object P.

Moreover, a boundary is between the boundary surface 410 of the resin 400 and the inner and outer surfaces 610, 620 of the optical window 600 and an air layer, wherein light reflects off the boundary. Any one of the internal reflection light occurs at the boundary surface 410 of the resin 400, the external reflection light reflects off the inner surface of the optical window 600, and the internal reflection light reflects off the outer surface of the optical window 600 may be directed back to the resin 400 of the proximity sensor A1 which may cause the crosstalk of the proximity sensor A1. This embodiment, as described below, is dedicated to alleviate crosstalk.

Firstly, crosstalk caused by internal reflection light that emitted from the VCSEL 200*a* then reflected off the boundary surface 410 of the resin 400 is under consideration.

Figure 5:
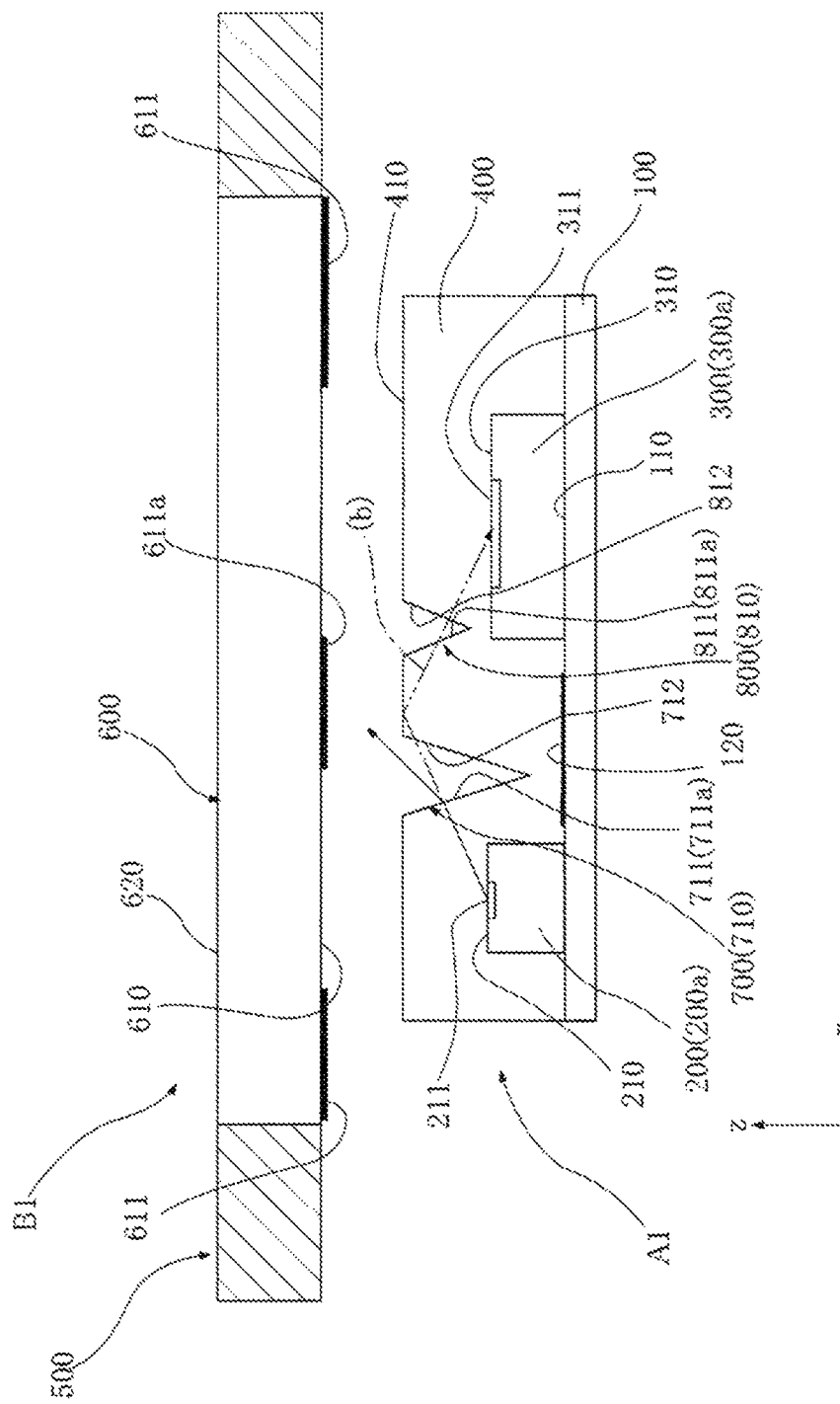
FIG. 5 is a diagram of the proximity sensor and electronic device shown in FIG. 1.

In the case of the first crosstalk alleviator 700 (the first groove 710) is absent, the emitted light associated with the path indicated by (b in FIG. 5 is likely to undergo internal reflection at the boundary surface 410 of the resin 400 and thus reach the light-receiving portion 311 of the photodiode 300*a*, thereby causing crosstalk, (Path (b) in FIG. 5 is shown by a dashed line.) However, in this embodiment, the light emitted from the VCSEL 200*a* exits from the inner surface 711 (the first inclined surface 711*a*) of the first groove 710 and reach the outside of the resin 400. Consequently, it is avoided for light to undergo internal reflection at the boundary surface 410 of the resin 400 and reach the light-receiving portion 311 of the photodiode 300*a*, thereby alleviating crosstalk.

Figure 6:
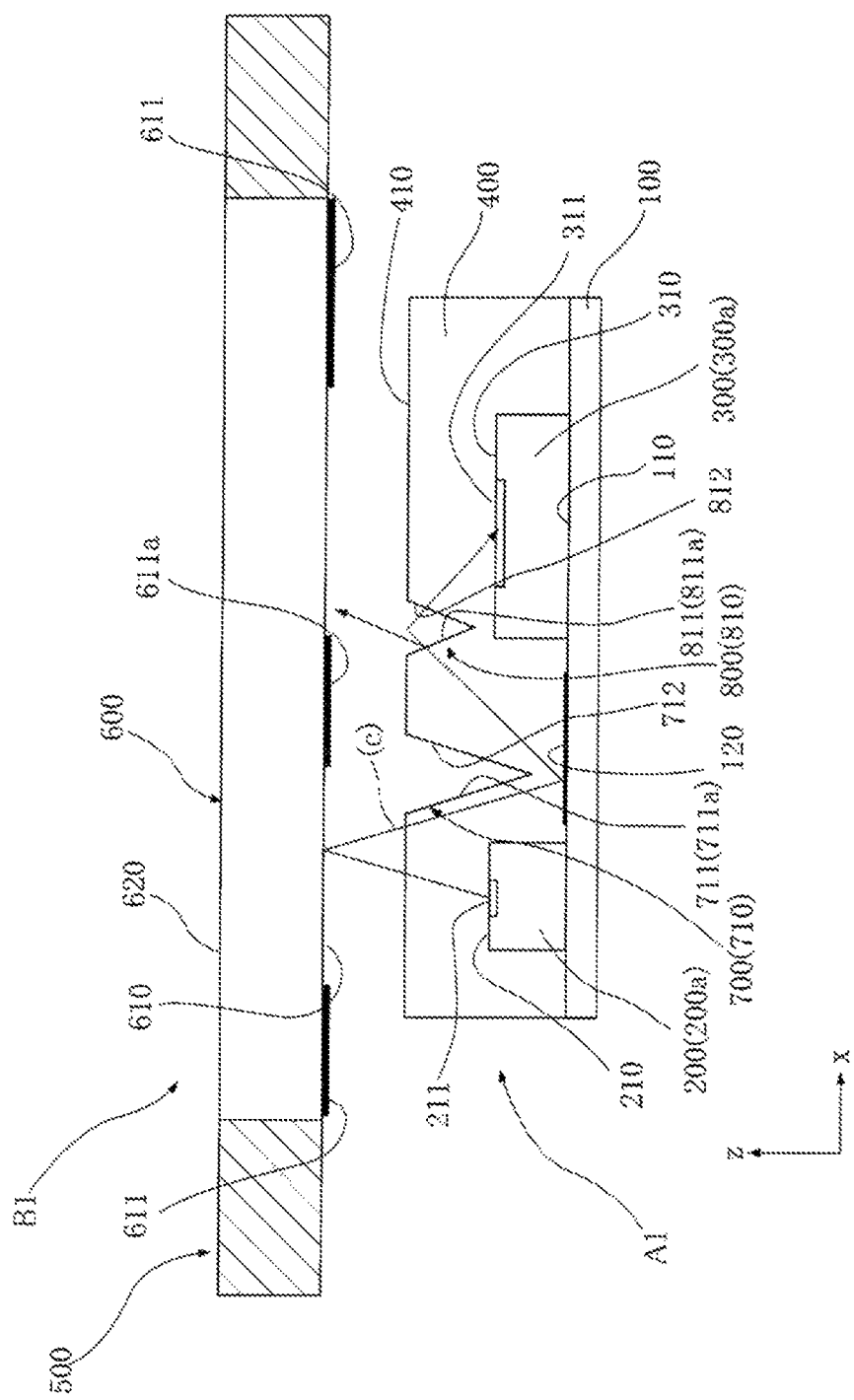
FIG. 6 is a diagram of the proximity sensor and electronic device shown in FIG. 1.

Next, the crosstalk caused by the light emitted from the VCSEL 200*a* and externally reflecting off the inner surface 610 of the optical window 600 is under consideration Referring to FIG. 6, the path denoted by (c) is illustrative of an exemplary embodiment as follows: the light emitted from the VCSEL 200*a* reflects off the inner surface 610 of the optical window 600 externally, returns to the inside of the resin 400, reflects off the main surface 110 of the substrate 100, passes under the first groove 710, propagates toward the boundary surface 410 of the resin 400 again, undergoes internal reflection at the boundary surface 410, and finally reaches the light-receiving portion 311 of the photodiode 300*a*, thereby causing crosstalk. (Path (c) FIG. 6 is shown by a dashed line.) However, in this embodiment, the light propagates to the boundary surface 410 of the resin 400 via the first groove 710 is emitted from the inner surface 811 (the second inclined surface 611a) of the second groove 810 to reach the outside of the resin 400. Consequently, it is avoided for light to undergo internal reflection on the boundary surface 410 of the resin 400 and reach the light-receiving portion 311 of the photodiode 300a, thereby alleviating crosstalk. In this embodiment by disposing the reflection index alleviator 120 on the main surface 110 of the substrate 100 and positioned between the VCSEL 200a and the photodiode 300a, light reflecting off the main surface 110 of the substrate 100 is alleviated along the path indicated by (c) in FIG. 6, thereby further alleviating crosstalk.

Figure 7:
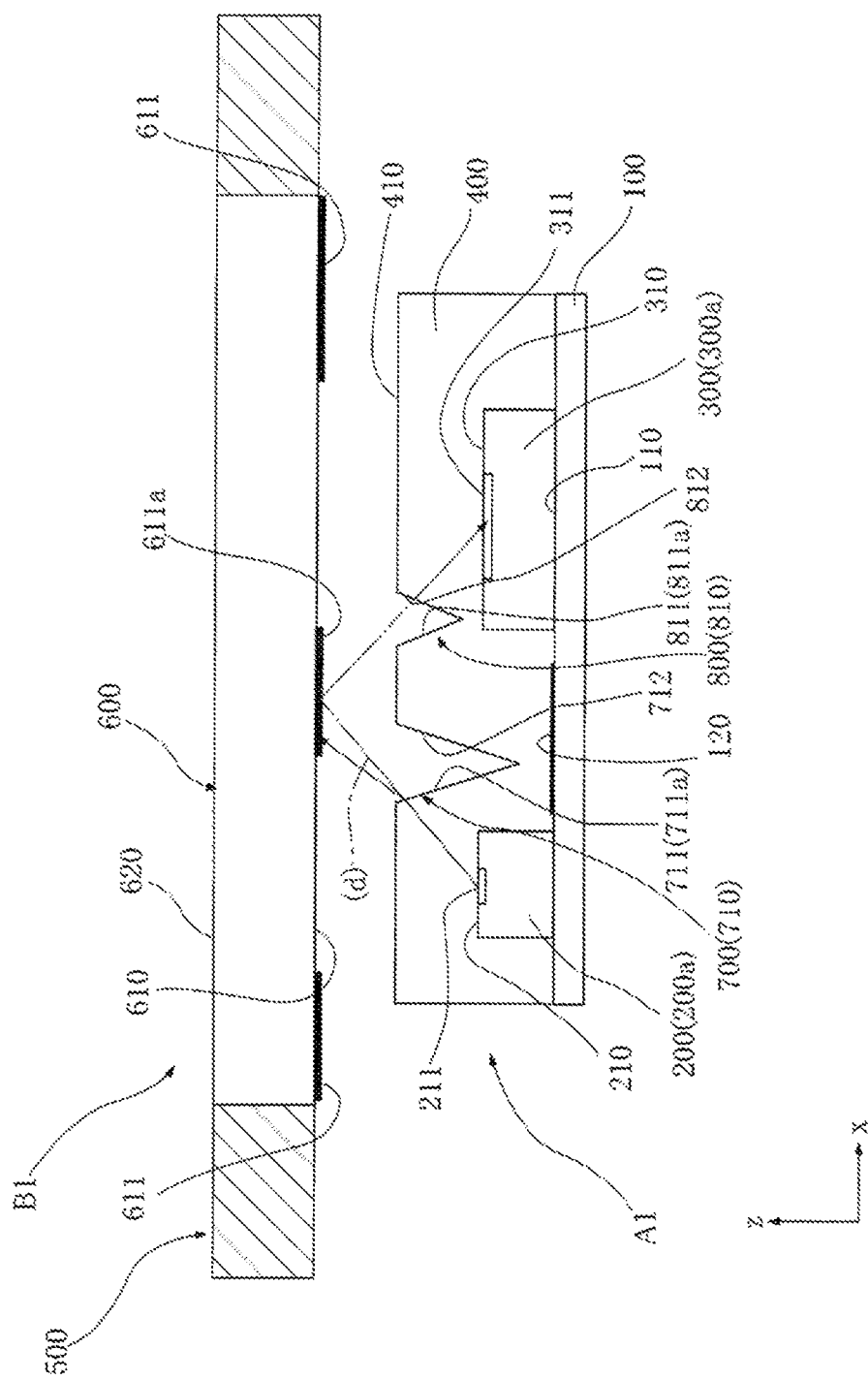
FIG. 7 is a diagram of the proximity sensor and electronic device shown in FIG. 1.

The possibility of crosstalk caused by the light emitted from the VCSEL 200a reflects off the inner surface 610 of the optical window 600 externally and reaches the light-receiving portion 311 of the photodiode 300a is shown as the path denoted by (d) in FIG. 7. (Path (d) in FIG. 7 is shown by a dashed line.) However, in this embodiment, the light-blocking film 611 formed on the inner surface 610 of the optical window 600 blocks the path. Consequently, it is avoided for light reflecting off the inner surface 610 of the optical window 600 to reach the light-receiving portion 311 of the photodiode 300a, thereby alleviating crosstalk.

Next, crosstalk caused by the light emitted from the VCSEL 200a and internally reflecting at the outer surface 620 of the optical window 600 is under consideration.

Figure 8:
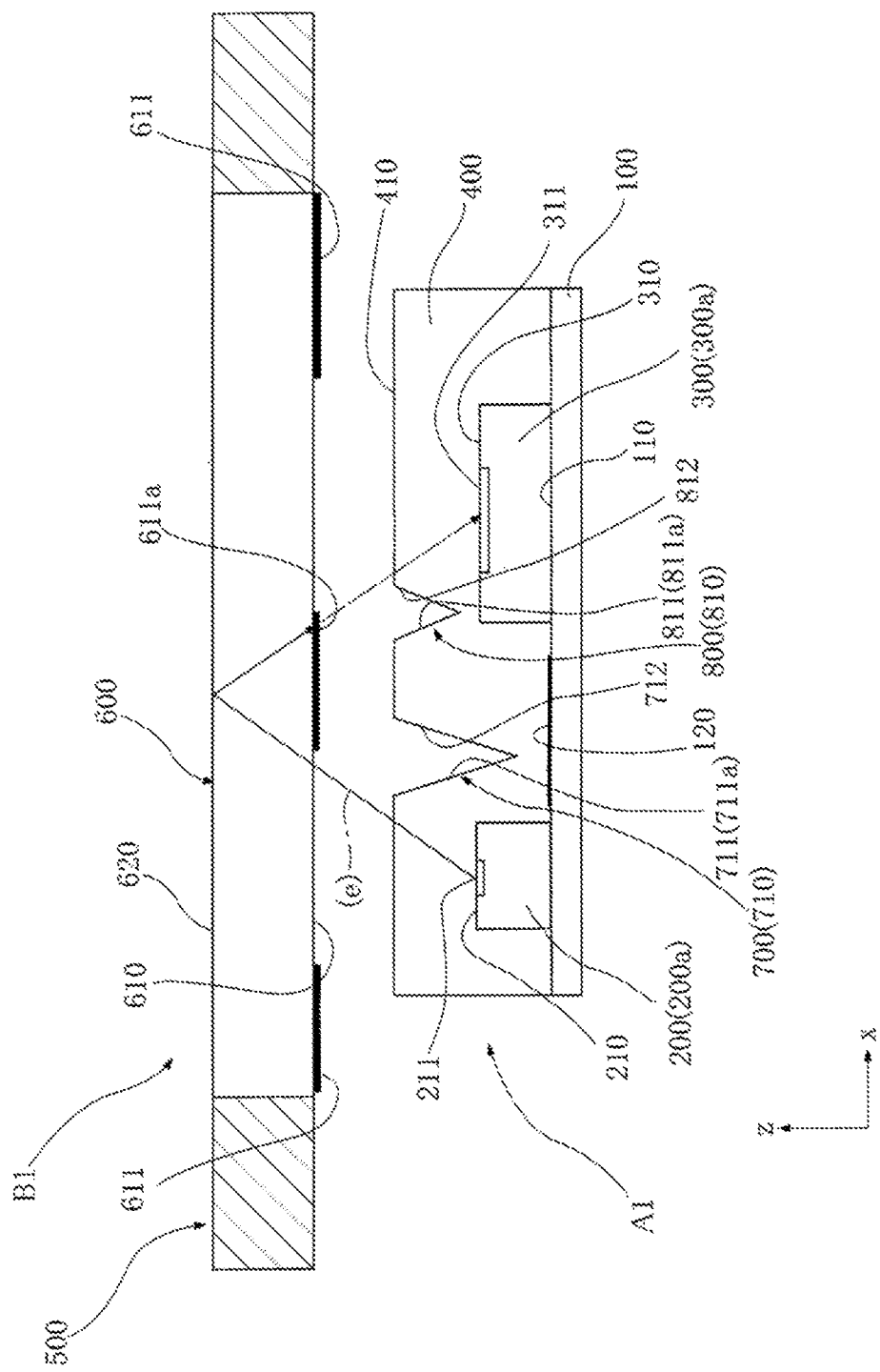
FIG. 8 is a diagram of the proximity sensor and electronic device shown in FIG. 1.

The possibility of crosstalk caused by the light emitted from the VCSEL 200a undergoes internal reflection on the outer surface 620 of the optical window 600 and reaches the light-receiving portion 311 of the photodiode 300a is illustrated as path denoted bye) in FIG. 8. (Path (e) FIG. 8 is shown by a dashed line.) However, in this embodiment, the light-blocking film 611 formed on the inner surface 610 of the optical window 600 blocks the path. Consequently, it is avoided for light reflecting off the outer surface 620 of the optical window 600 to reach the light-receiving portion 311 of the photodiode 300a, thereby alleviating crosstalk.

Figure 9:
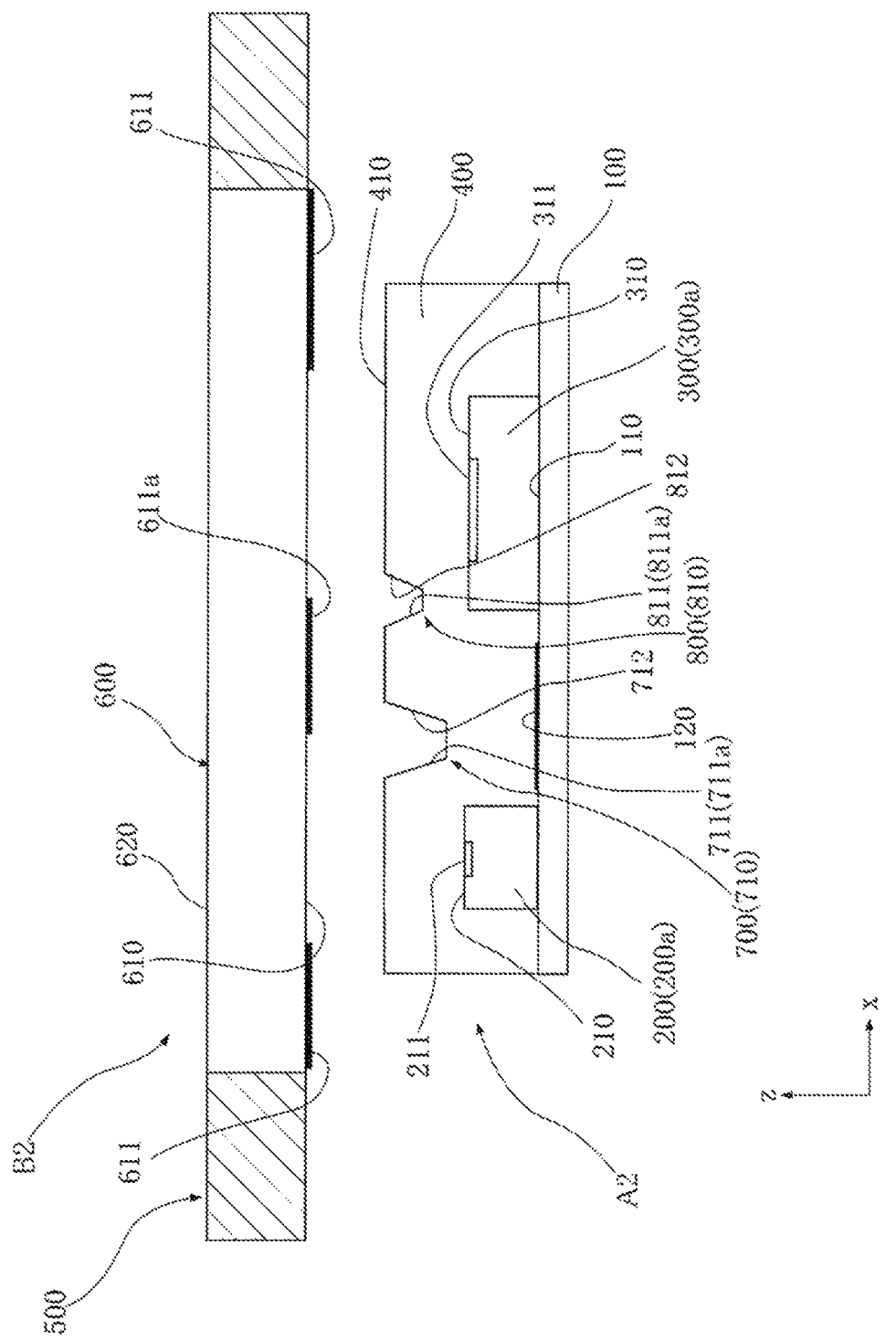
FIG. 9 is a schematic view of the proximity sensor and electronic device according to the second embodiment of the present disclosure.

FIG. 9 is a schematic view of a proximity sensor A2 and an electronic device B2 using the same according to the second embodiment of the present disclosure. Identical or equivalent elements in the first and second embodiments are denoted by identical reference numerals in FIG. 1 to FIG. 8 and FIG. 9 and are, for the sake of brevity, not repeatedly described below.

Compared to their counterparts in the first embodiment, the proximity sensor A2 and the electronic device B2 using the same in the second embodiment have a distinguishing technical feature: the first groove 710 (the first crosstalk alleviator 700) and the second groove 810 (the second crosstalk alleviator 800) each have an inverted trapezoidal cross section profile. The first groove 710 in the second embodiment also has the first inclined surface 711a of the first embodiment. The second groove 810 in the second embodiment also has the second inclined surface 811a of the first embodiment. Therefore, the proximity sensor A1 and the electronic device B2 using the same in the second embodiment are as effective as their counterparts in the first embodiment in alleviating crosstalk.

Figure 10:
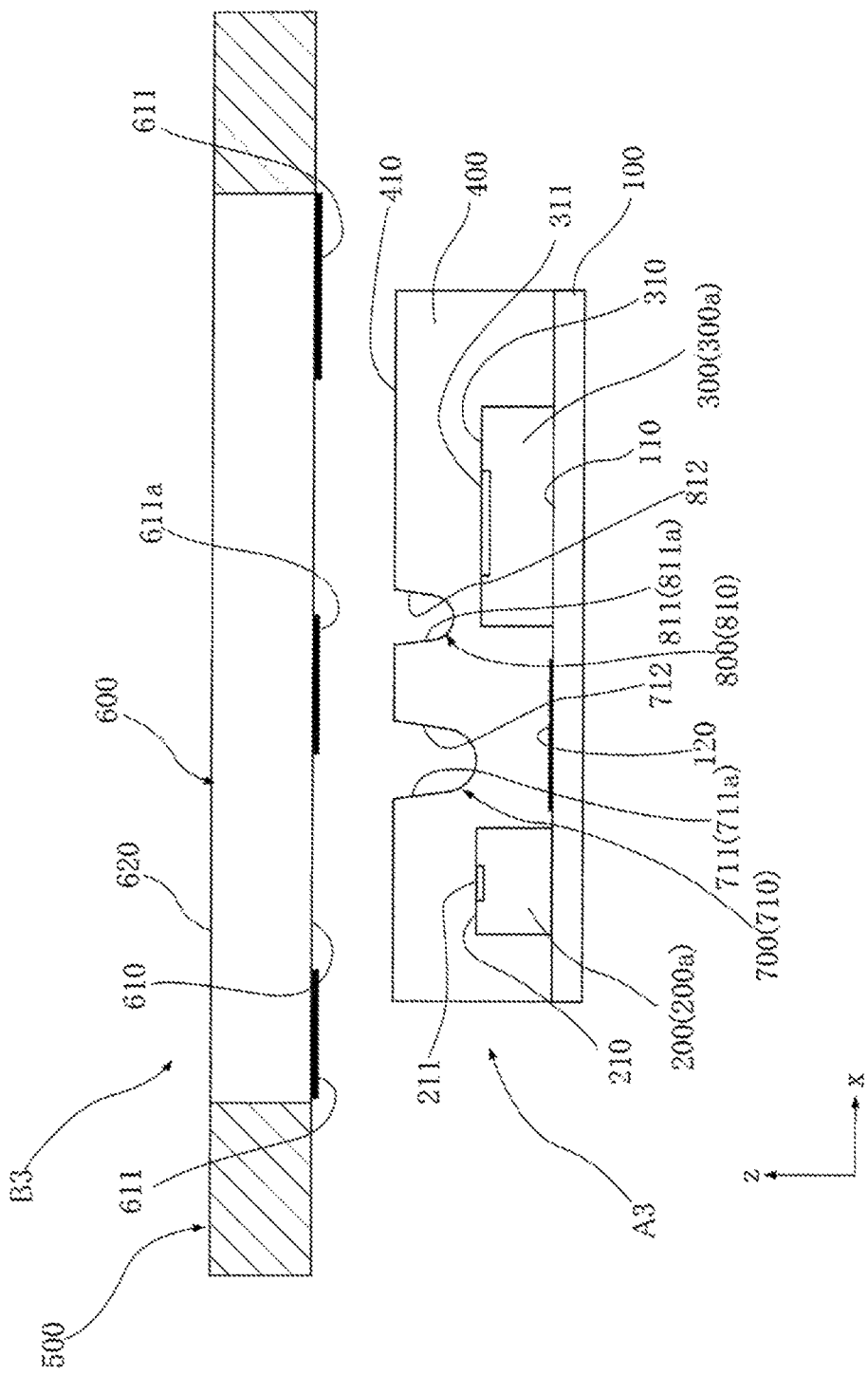
FIG. 10 is a schematic view of the proximity sensor and electronic device according to the third embodiment of the present disclosure.

FIG. 10 is a schematic view of a proximity sensor A3 and an electronic device B3 using the same according to the third embodiment of the present disclosure. Identical or equivalent elements in the first and third embodiments are denoted by identical reference numerals in FIG. 1 to FIG. 8 and FIG. 10 and are, for the sake of brevity, not repeatedly described below.

Compared to their counterparts in the first embodiment, the proximity sensor A3 and the electronic device B3 using the same in the third embodiment have a distinguishing technical feature: the first groove 710 (the first crosstalk alleviator 700) and the second groove 810 (the second crosstalk alleviator 800) each have a U-shaped cross section or a hemispherical cross section. In the third embodiment, both the first inclined surface 711a of the first groove 710 and the second inclined surface 811a of the second groove 810 are curved and concave. Similar to the first embodiment, the third embodiment is advantageous in that the first inclined surface 711a and the second inclined surface 811a enable light that may cause crosstalk to propagate toward the outside of the resin 400 and thus avoiding internal reflection at the boundary surface 410 of the resin 400. Therefore, the proximity sensor A3 and the electronic device B3 using the same in the third embodiment are as effective as their counterparts in the first embodiment in alleviating crosstalk.

FIG. 11 to FIG. 15 are schematic views of a proximity sensor A4 and an electronic device B4 using the same according to the fourth embodiment of the present disclosure. Identical or equivalent elements in the first and fourth embodiments are denoted by identical reference numerals in FIG. 1 to FIG. 8 and FIG. 11 to FIG. 15 and are for the sake of brevity, not repeatedly described below.

The proximity sensor A4 and the electronic device B4 using the same in the fourth embodiment are different from their counterparts in the first embodiment in terms of the first crosstalk alleviator 700 and the second crosstalk alleviator 800 as described below Regarding the proximity sensor A4 in this embodiment, the first crosstalk alleviator 700 is disposed between the VCSEL 200a and the photodiode 300a and is a first stripe 720. The first stripe 720 is formed on the boundary surface 410, has a triangular cross section profile, and extends in the y-direction uniformly. The first stripe 720 has a flat outer surface 721. The flat outer surface 721 slopes upward (i.e., in the direction from the boundary surface 410 to the top of the first stripe 720) toward the VCSEL 200a. The flat outer surface 721 is equivalent to the first inclined surface 711a. In the first embodiment, the inner surface 711 (the inner surface 711 is closer to the VCSEL 200a than the inner surface 712) of the first groove 710 with a V-shaped cross section is deemed as the first inclined surface 711a. In this embodiment, the outer surface 721 (which is closer to the photodiode 300a than another outer surface 722 of the first stripe 720) of the first stripe 720 is deemed as the first inclined surface 711a. The height of the first stripe 720 is preferably less than ½ of the thickness of the resin 400. Moreover, the angle between the two outer surfaces 721, 722 of the first stripe 720 can be appropriately set according to the distance between the light-emitting surface 210 of the VCSEL 200a and the boundary surface 410 of the resin 400, the distance between the boundary surface 410 and the inner surface 610 of the optical window 600, the thickness of the optical window 600, the distance between the VCSEL 200a and the photodiode 300a, and the distance between the light-receiving surface 310 of the photodiode 300a and the boundary surface 410 of the resin 400.

Regarding the proximity sensor A4 in this embodiment, the second crosstalk alleviator 800 is spaced away from the first stripe 720 in the x-direction toward the side of the photodiode 300a and spaced away from the light-receiving portion 311 of the photodiode 300a in the x-direction toward the side of the VCSEL 200a, wherein the second crosstalk alleviator 800 is a second stripe 820 formed on the boundary surface 410 that has a triangular cross section profile, and extending in the y-direction uniformly. The second stripe 820 has a flat outer surface 821 that slopes upward in the direction from the boundary surface 410 toward the top of the second stripe 820 and toward the side of the VCSEL 200*a*. The flat outer surface 821 is equivalent to the second inclined surface 811*a*. In the first embodiment, the inner surface 711 (the inner surface 711 is closer to the VCSEL 200*a* than the inner surface 712) of the first groove 710 with a V-shaped cross section is deemed as the first inclined surface 711*a*. In this embodiment, the outer surface 821 (which is closer to the photodiode 300*a* than another outer surface 822 of the second stripe 820) of the second stripe 820 is deemed as the second inclined surface 811*a*. The height of the second stripe 820 is preferably less than ⅓ of the thickness of the resin 400. Moreover, the angle between the two cuter surfaces 821, 822 of the second stripe 820 can be appropriately set according to the distance between the light-emitting surface 210 of the VCSEL 200*a* and the boundary surface 410 of the resin 400, the distance between the boundary surface 410 and the inner surface 610 of the optical window 600, the thickness of the optical window 600, the distance between the VCSEL 200*a* and the photodiode 300*a*, and the distance between the light-receiving surface 310 of the photodiode 300*a* and the boundary surface 410 of the resin 400.

The roles of the first crosstalk alleviator 700 and the second crosstalk alleviator 800 in the proximity sensor A4 and the electronic device B4 in the fourth embodiment are described below.

Figure 11:
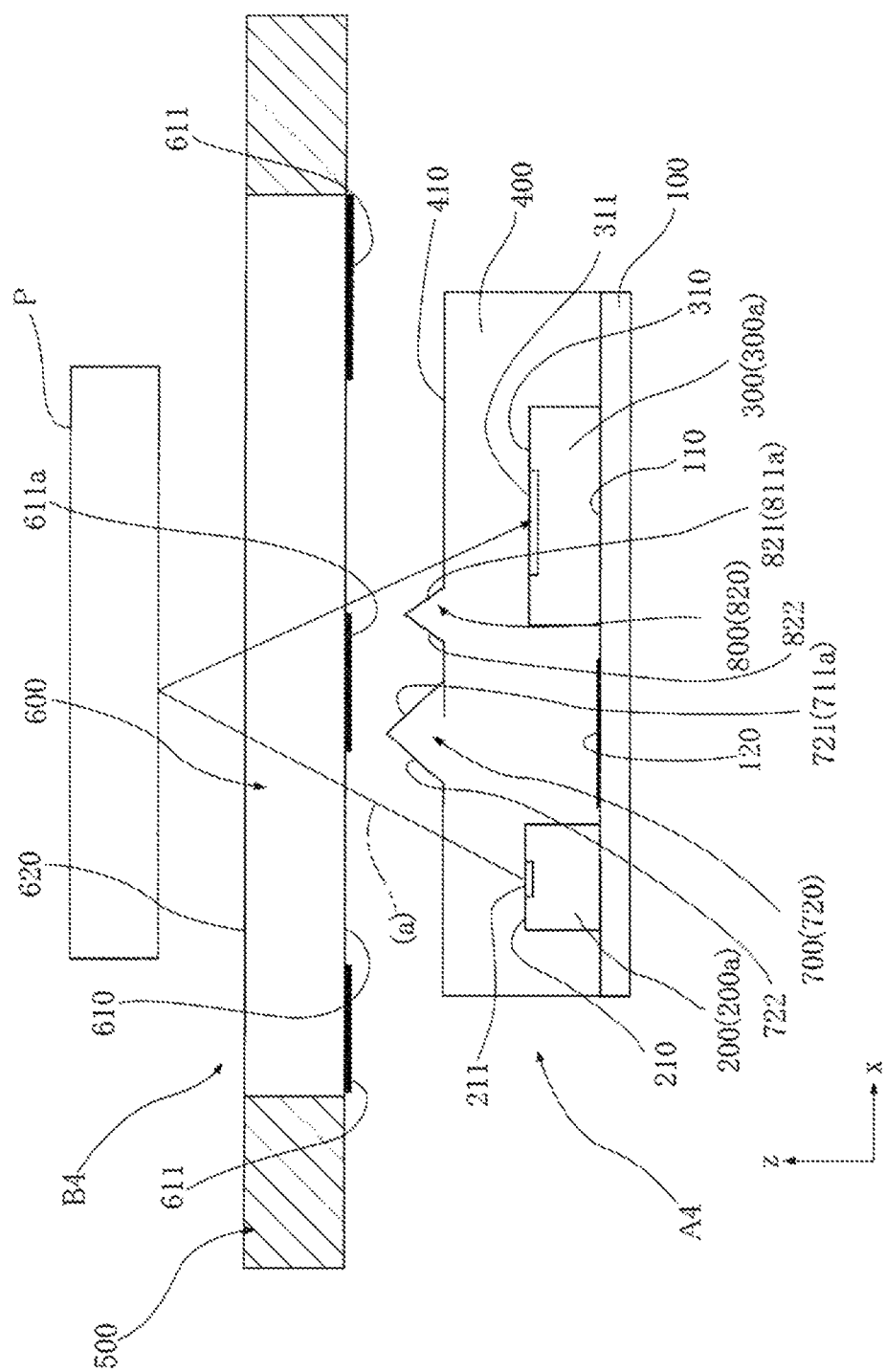
FIG. 11 is a schematic view of the proximity sensor and electronic device according to the fourth embodiment of the present disclosure.

The presence of the target object P is detected and determined according to whether the light emitted from the VCSEL 200*a* propagates and reaches the light-receiving portion 311 of the photodiode 300*a* by following the path indicated by (a) in FIG. 11, that is, in the same way as described about the first embodiment illustrated by FIG. 4.

Next, crosstalk caused by the light emitted from the VCSEL 200*a* and undergoing internal reflection at the boundary surface 410 of the resin 400 is under consideration.

Figure 12:
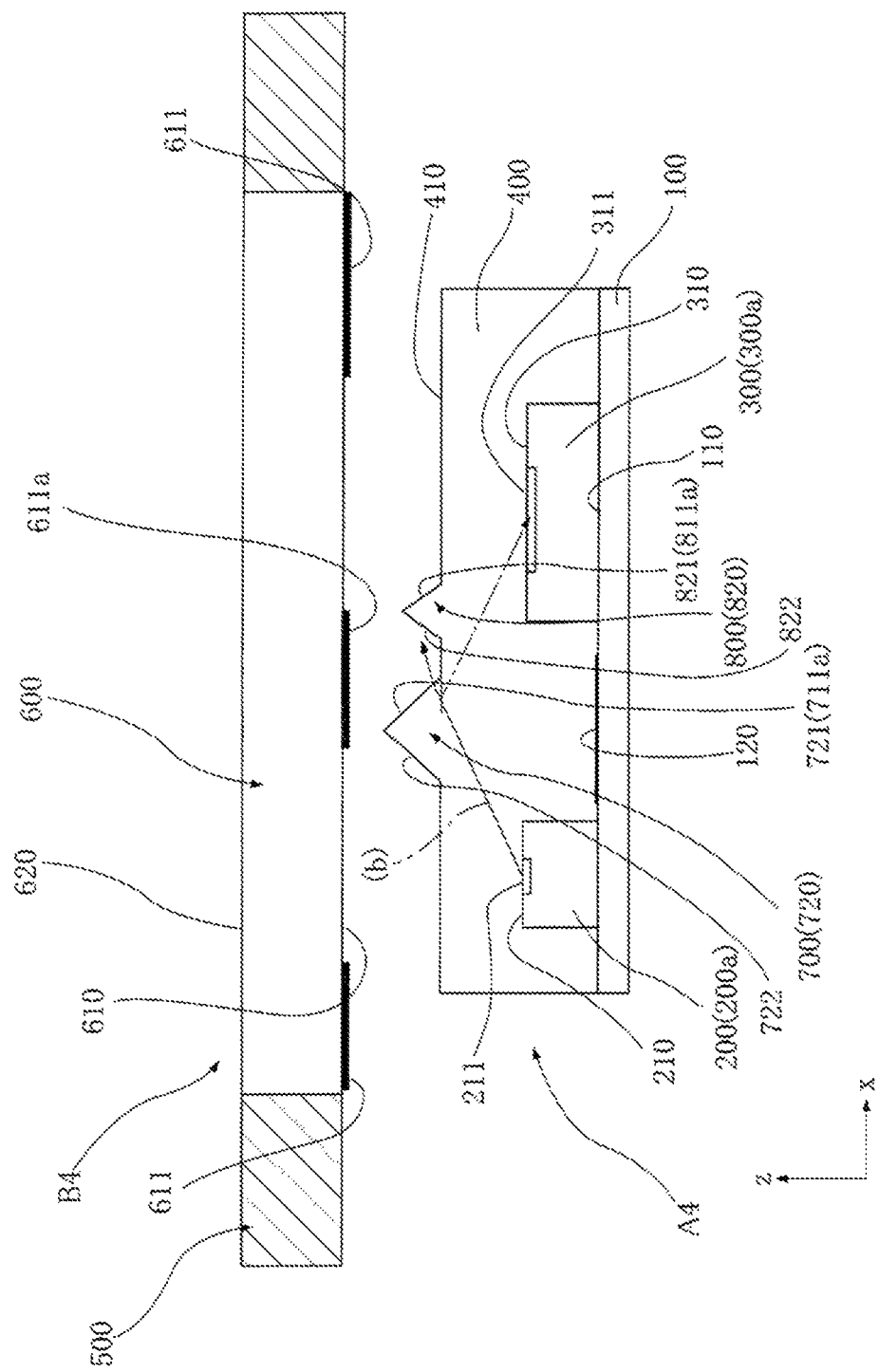
FIG. 12 is a diagram of the proximity sensor and electronic device shown in FIG. 11.

In the case of the first crosstalk alleviator 700 (the first stripe 720) is absent, crosstalk may occur due to the emitted light associated with the path indicated by (b) in FIG. 12 undergoing Internal reflection at the boundary surface 410 of the resin 400 and thus reach the light-receiving portion 311 of the photodiode 300*a*. (Path (b) In FIG. 12 is shown by a dashed line) However, in this embodiment, the light emitted from the VCSEL 200*a* is emitted from the outer surface 721 (the first inclined surface 711*a*) of the first stripe 720 and thus reaches the outside of the resin 400. Consequently, it is avoided for light to undergo internal reflection at the boundary surface 410 of the resin 400 and reach the light-receiving portion 311 of the photodiode 300*a*, thereby alleviating crosstalk.

Next, crosstalk caused by the light emitted from the VCSEL 200*a* and externally reflecting off the inner surface 610 of the optical window 600 is under consideration.

Figure 13:
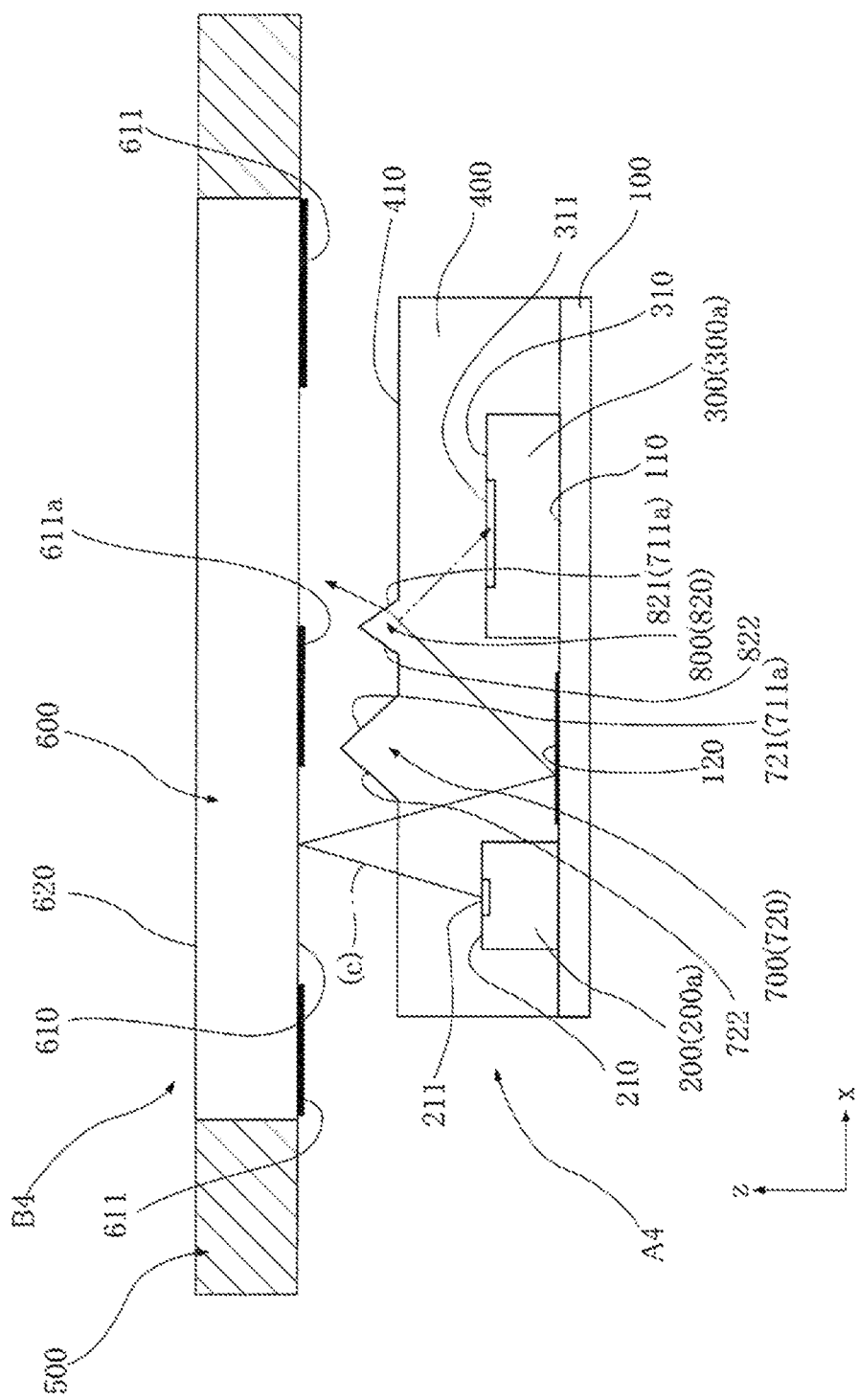
FIG. 13 is a diagram of the proximity sensor and electronic device shown in FIG. 11.

The possibility of crosstalk caused by the light emitted from the VCSEL 200*a* externally reflects off the inner surface 610 of the optical window 600, then returns to the Inside of the resin 400, reflects off the main surface 110 of the substrate 100, passes under the first stripe 720, propagates toward the boundary surface 410 of the resin 400 again, undergoes internal reflection on the boundary surface 410, and finally reaches the light-receiving portion 311 of the photodiode 300*a* is illustrated as path (c) FIG. 13. (Path (c) in FIG. 13 is shown by a clashed line.) However, in this embodiment, the light propagates to the boundary surface 410 of the resin 400 via the part under the first stripe 720 exits from the outer surface 821 (the second inclined surface 811*a*) of the second stripe 820 to reach the outside of the resin 400. Consequently, it is avoided for light to undergo internal reflection on the boundary surface 410 of the resin 400 and reach the light-receiving portion 311 of the photodiode 300*a*, thereby alleviating crosstalk. In this embodiment, by disposing the reflection index alleviator 120 on the main surface 110 of the substrate 100 and positioned between the VCSEL 200*a* and the photodiode 300*a*, light reflecting off the main surface 110 of the substrate 100 is alleviated along the path indicated by (c) in FIG. 13, thereby further alleviating crosstalk.

Figure 14:
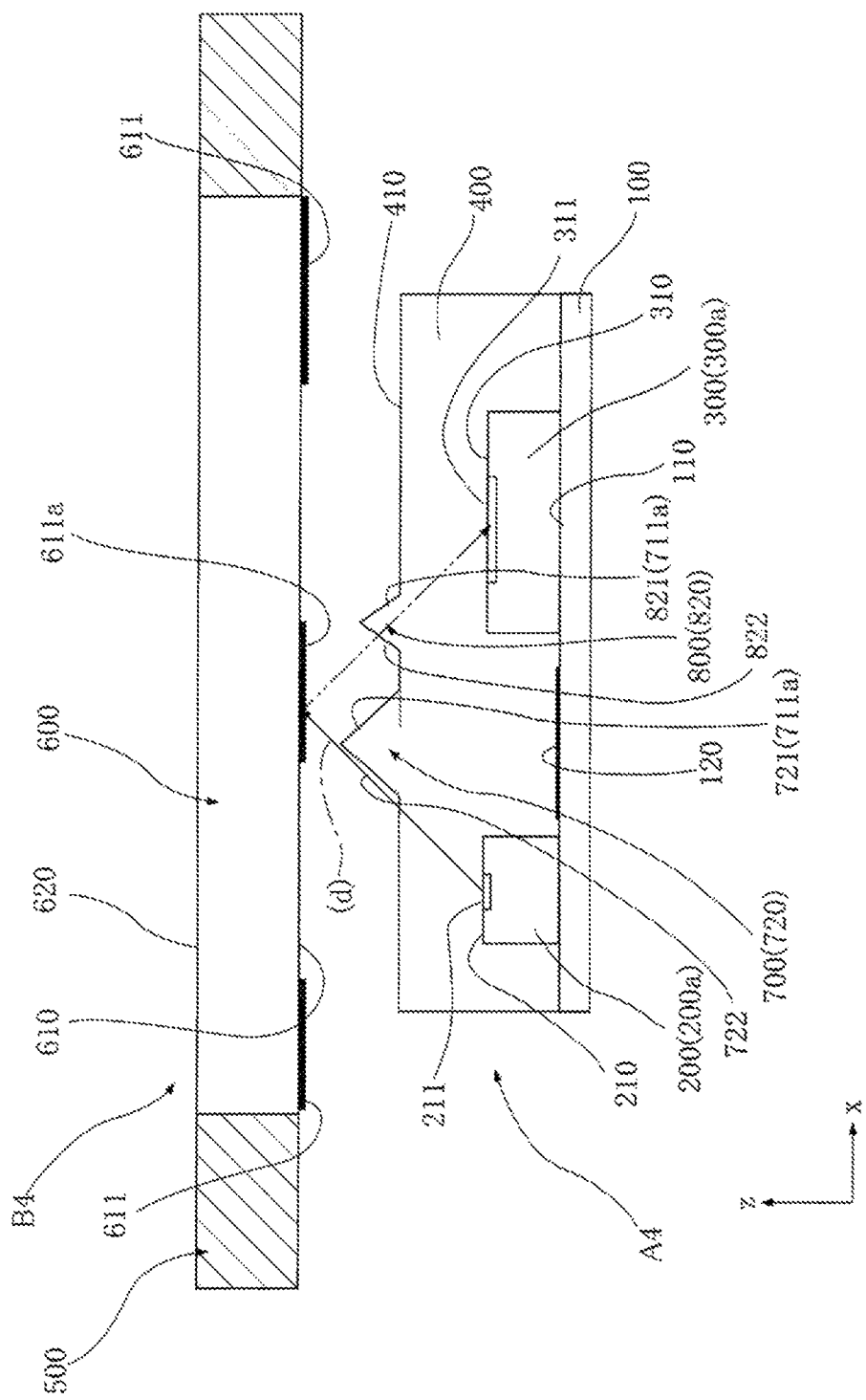
FIG. 14 is a diagram of the proximity sensor and electronic device shown in FIG. 11.

The possibility of crosstalk caused by the light emitted from the VCSEL 200*a* reflects off the inner surface 610 of the optical window 600 externally and reaches the light-receiving portion 311 of the photodiode 300*a* is illustrated as path (d) in FIG. 14. (Path (d) in FIG. 14 is shown by a dashed line.) However, in this embodiment, with the light-blocking film 611 being formed on the inner surface 610 of the optical window 600, the light-blocking film 611 blocks the path. Consequently, it is avoided for light reflecting off the inner surface 610 of the optical window 600 to reach the light-receiving portion 311 of the photodiode 300*a*, thereby alleviating crosstalk.

Figure 15:
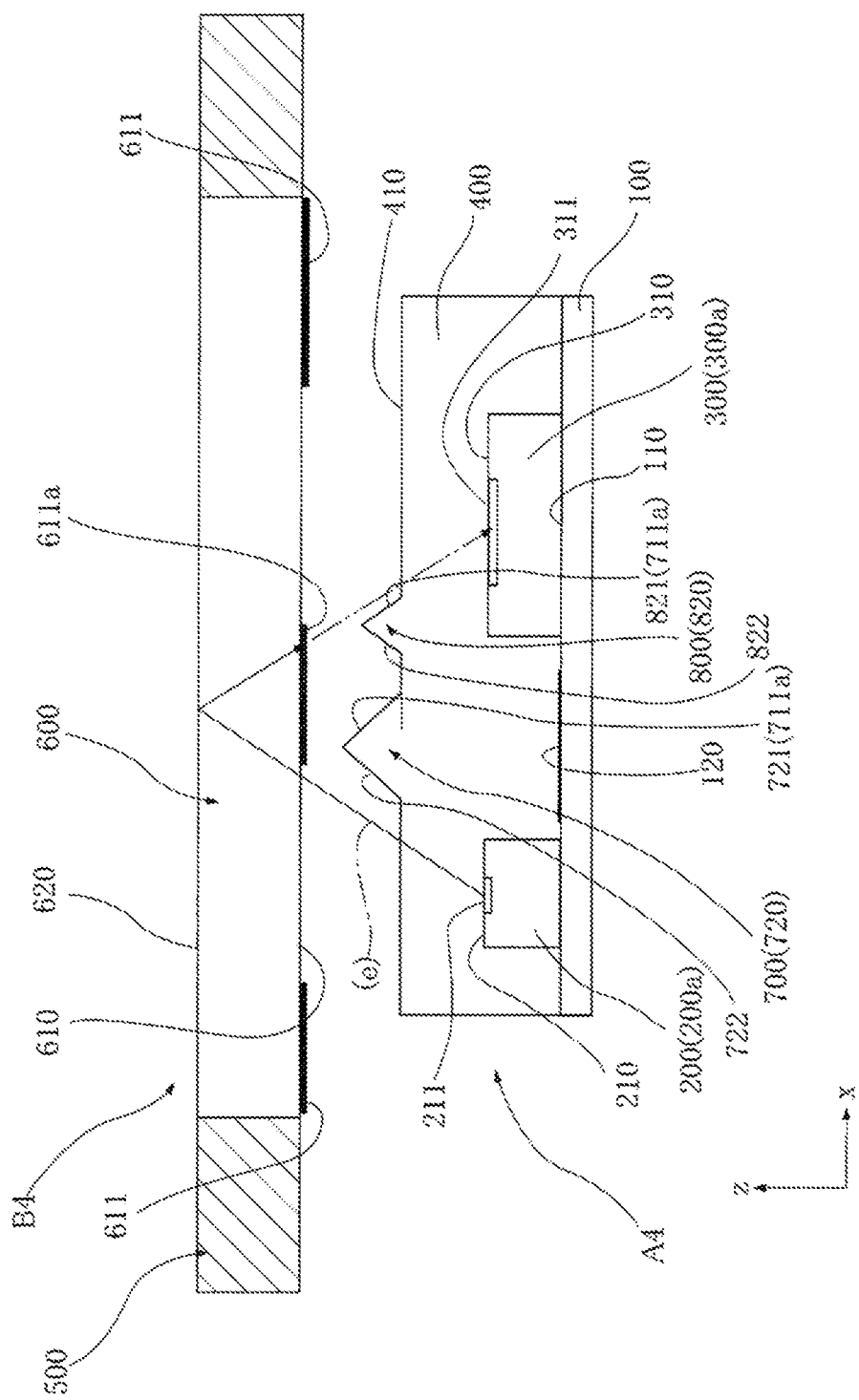
FIG. 15 is a diagram of the proximity sensor and electronic device shown in FIG. 11.

The possibility of crosstalk caused by the light emitted from the VCSEL 200*a* undergoes internal reflection on the outer surface 620 of the optical window 600 and reaches the light-receiving portion 311 of the photodiode 300*a* is illustrated as path (e) FIG. 15. (Path (e) in FIG. 15 is shown by a dashed line.) However, in this embodiment, with the light-blocking film 611 being formed on the inner surface 610 of the optical window 600, the light-blocking film 611 blocks the path. Consequently, it is avoided for light reflecting off the outer surface 620 of the optical window 600 to reach the light-receiving portion 311 of the photodiode 300*a*, thereby alleviating crosstalk.

Figure 16:
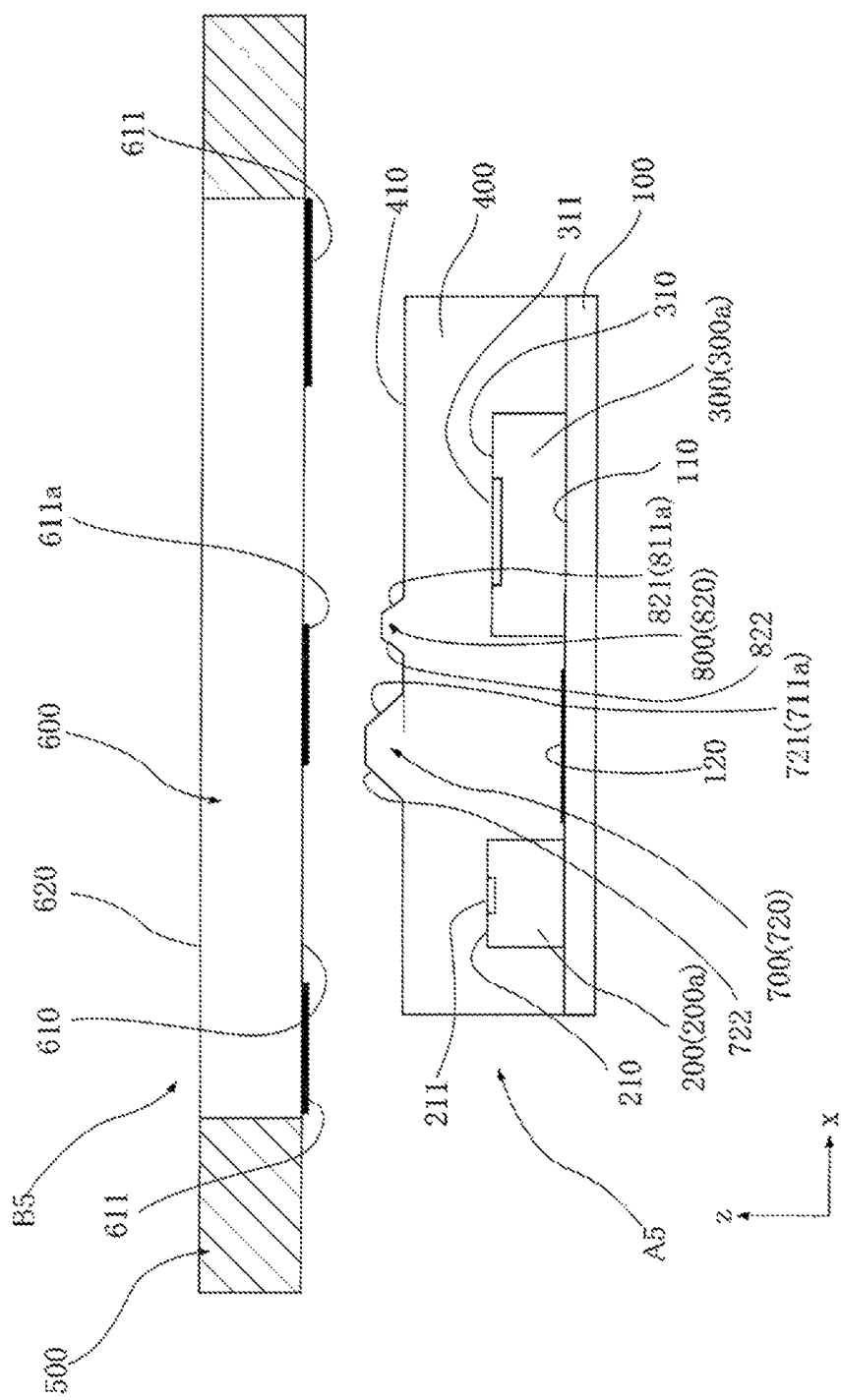

FIG. 16 is a schematic view of a proximity sensor A5 and an electronic device B5 according to the fifth embodiment of the present disclosure. Identical or equivalent elements in the first and fifth embodiments are denoted by identical reference numerals in FIG. 1 to FIG. 8 and FIG. 16 and are, for the sake of brevity, not repeatedly described below.

Compared to their counterparts in the fourth embodiment, the proximity sensor A5 and the electronic device B5 using the same in the fifth embodiment have a distinguishing technical feature: the first stripe 720 which constitutes the first crosstalk alleviator 700 has a trapezoidal cross section, so is the second stripe 820 which constitutes the second crosstalk alleviator 800. In the fifth embodiment, the first stripe 720 has the first inclined surface 711*a* described in the fourth embodiment, and the second stripe 820 has the second inclined surface 811*a* described in the fourth embodiment. Therefore, similarly, the proximity sensor A5 and the electronic device B5 using the same in the fifth embodiment can be as effective as their counterparts in the fourth embodiment in alleviating crosstalk.

FIG. 17 is a schematic view of a proximity sensor A6 and an electronic device B6 using the same according to the sixth embodiment of the present disclosure. Identical or equivalent elements in the first and sixth embodiments are denoted by identical reference numerals in FIG. 1 to FIG. 8 and FIG. 17 and are, for the sake of brevity, not repeatedly described below.

Compared to their counterparts in the fourth embodiment, the proximity sensor A6 and the electronic device B6 using the same in the sixth embodiment have a distinguishing technical feature: the first stripe 720 which constitutes the first crosstalk alleviator 700 has an inverted U-shaped or hemispherical cross section, so is the second stripe 820 which constitutes the second crosstalk alleviator 800. In the sixth embodiment, the first inclined surface 711*a* of the first stripe 720 is curved and convex, so is the second inclined surface 811*a* of the second stripe 820. Similar to the fourth embodiment, the sixth embodiment is advantageous in that the first inclined surface 711*a* and the second inclined surface 811*a* enable crosstalk-induced light to propagate toward the outside of the resin 400, thereby avoiding internal reflection at the boundary surface 410 of the resin 400. Therefore, similarly, the proximity sensor A6 and the electronic device B6 using the same in the sixth embodiment can be as effective as their counterparts in the fourth embodiment in alleviating crosstalk.

FIG. 18~FIG. 22 are schematic views of a proximity sensor A7 and an electronic device B7 using the same according to the seventh embodiment of the present disclosure. Identical or equivalent elements in the first and seventh embodiments are denoted by identical reference numerals in FIG. 1 to FIG. 8 and FIG. 18 to FIG. 22 and are, for the sake of brevity, not repeatedly described below.

Regarding the proximity sensor A7 and the electronic device B7 using the same in the seventh embodiment, the first crosstalk alleviator 700 is structurally different from its counterpart in the first embodiment as described below.

Regarding the proximity sensor A7 in this embodiment, the first crosstalk alleviator 700 has the following technical features: the boundary surface 410 parallel to the main surface 110 of the substrate 100 can be divided into a first portion 411 at a relatively higher level on the side of the VCSEL 200*a* and a second portion 412 on the side of the photodiode 300*a*, and further include a flat inclined surface 413 connecting the first portion 411 and the second portion 412, wherein the inclined surface 413 is deemed as the first inclined surface 711*a*. The second crosstalk alleviator 800 in this embodiment is the same as the second groove 810 in the first embodiment that has a V-shaped cross section profile.

The presence of the target object P is detected and determined according to whether the light emitted from the VCSEL 200*a* propagates and reaches the light-receiving portion 311 of the photodiode 300*a* by following the path indicated by (a) in FIG. 18, that is, in the same way as described about the first embodiment illustrated by FIG. 4.

In this embodiment, in the case of the first crosstalk alleviator 700 is absent, it is possible that the emitted light associated with the path indicated by (b) in FIG. 19 may undergo internal reflection at the boundary surface 410 of the resin 400 and thus reach the light-receiving portion 311 of the photodiode 300*a*, thereby causing crosstalk, (Path (b) in FIG. 19 is shown by a dashed line.) But with the inclined surface 413 being connected between the higher-leveled first portion 411 and the lower-leveled second portion 412 of the boundary surface 410 of the resin 400, the light emitted from the VCSEL 200*a* exits from the inclined surface 413 (the first inclined surface 711*a*) and reaches the outside of the resin 400. Consequently, it is avoided for emitted light to undergo internal reflection on the boundary surface 410 of the resin 400 and reach the light-receiving portion 311 of the photodiode 300*a*, thereby alleviating crosstalk.

As respectively shown in the path (c) of FIG. 20, path (d) of FIG. 21, and path (e) of FIG. 22, in the case of the light emitted from the VCSEL 200*a* reflects off the inner surface 610 of the optical window 600 externally, and in the case of the light emitted from the VCSEL 200*a* undergoes internal reflection at the outer surface 620 of the optical window 600, crosstalk can similarly be appropriately alleviated like the aforesaid embodiments.

The scope of the present disclosure is not restricted to the aforesaid embodiments. All possible changes to the claims of the present disclosure are deemed falling within the scope of the present disclosure.

In addition to the VCSEL 200*a*, the light emitter 200 can also be a light emitting photodiode.

According to the above embodiments, the first crosstalk alleviator 700 is provided in the form of: (1) a groove with a V-shaped cross section (in the first embodiment), (2) a groove with an inverted trapezoidal cross section (in the second embodiment), (3) a groove with a U-shaped or hemispherical cross section (in the third embodiment), (4) a stripe with a triangular cross section (in the fourth embodiment), (5) a stripe with a trapezoidal cross section (in the fifth embodiment), (6) a stripe with an inverted U-shaped or hemispherical cross section (in the sixth embodiment), and (7) an inclined surface connecting the high first portion and the low second portion of the resin (in the seventh embodiment), whereas the second crosstalk alleviator 800 is provided in the form of: (8) a groove with a V-shaped cross section (in the first embodiment), (9) a groove with an inverted trapezoidal cross section (in the second embodiment), (10) a groove with a U-shaped or hemispherical cross section (in the third embodiment), (11) stripe with a triangular cross section (in the fourth embodiment), (12) a stripe with a trapezoidal cross section (in the fifth embodiment), and (13) a stripe with an inverted U-shaped or hemispherical cross section (in the sixth embodiment). The first crosstalk alleviator 700 provided in any one of the forms (1)~(7) operates efficiently in conjunction with the second crosstalk alleviator 800 provided in any one of the forms (8)~(13).

Moreover, regarding the first crosstalk alleviator 700 and the second crosstalk alleviator 800, it is important for an inner surface of the groove or an outer surface of the stripe to slope toward the light emitter (VCSEL) while extending, either with a flat or curved outline profile, away from the main surface of the substrate, but the other inner surface of the groove or the other outer surface of the stripe is not necessarily limited.

What is claimed is:
1. A proximity sensor, comprising:
a substrate including a main surface;
a light emitter and a light receiver disposed on the main surface;
a resin disposed on the main surface, enclosing the light emitter and the light receiver, and including a boundary surface spaced apart from the main surface;
a first crosstalk alleviator disposed on the boundary surface and including a first inclined surface; and
a second crosstalk alleviator disposed on the boundary surface and including a second inclined surface,
wherein:
an end point or an end surface of the first crosstalk alleviator is separated from the boundary surface by a first distance,
an end point or an end surface of the second crosstalk alleviator is separated from the boundary surface by a second distance,
the first distance is greater than the second distance,
a first horizontal distance between the first crosstalk alleviator and the light emitter is less than a second horizontal distance between the second crosstalk alleviator and the light emitter, and
the proximity sensor is free of any other cross-talk alleviator in a space between the light emitter and the light receiver from a top of the light emitter or the light receiver through the first and second crosstalk alleviators.

2. The proximity sensor of claim 1, wherein the first crosstalk alleviator is disposed between the light emitter and the light receiver, and the second crosstalk alleviator is closer to the light receiver comparing to the first crosstalk alleviator.

3. The proximity sensor of claim 2, wherein the first inclined surface and the second inclined surface incline away from the main surface of the substrate and toward the light emitter.

4. The proximity sensor of claim 1, wherein the boundary surface is flat and parallel to the main surface of the substrate except for portions disposed with the first crosstalk alleviator and the second crosstalk alleviator.

5. The proximity sensor of claim 3, wherein the first crosstalk alleviator is a first groove formed on the boundary surface and extending in a direction orthogonal to another direction which the light emitter and the light receiver are aligned along, and an inner surface of the first groove closer to the light emitter constitutes the first inclined surface.

6. The proximity sensor of claim 4, wherein the first crosstalk alleviator is a first groove formed on the boundary surface and extending in a direction orthogonal to another direction which the light emitter and the light receiver are aligned along, and an inner surface of the first groove closer to the light emitter constitutes the first inclined surface.

7. The proximity sensor of claim 5, wherein the first inclined surface is flat and inclines from a bottom of the first groove to the boundary surface toward the light emitter.

8. The proximity sensor of claim 7, wherein the first groove has a V-shaped or inverted trapezoidal cross section profile.

9. The proximity sensor of claim 5, wherein the first inclined surface is curved and concave and slopes from a bottom of the first groove to the boundary surface toward the light emitter.

10. The proximity sensor of claim 9, wherein the first groove has a U-shaped or hemispherical cross section profile.

11. The proximity sensor of claim 4, wherein the first crosstalk alleviator is a first stripe formed on the boundary surface and extending in a direction orthogonal to another direction which the light emitter and the light receiver are aligned along, and a surface of the first stripe closer to the light receiver constitutes the first inclined surface.

12. The proximity sensor of claim 11, wherein the first inclined surface is flat and slopes from a top of the first stripe to the boundary surface toward the light receiver.

13. The proximity sensor of claim 12, wherein the first stripe has a triangular or trapezoidal cross section profile.

14. The proximity sensor of claim 11, wherein the first inclined surface is curved, convex and slopes from a top of the first stripe to the boundary surface toward the light receiver.

15. The proximity sensor of claim 14, wherein the first stripe has an inverted U-shaped or hemispherical cross section profile.

16. The proximity sensor of claim 3, wherein the second crosstalk alleviator is a second groove formed on the boundary surface and extending in a direction orthogonal to another direction which the light emitter and the light receiver are aligned along, and an inner surface of the second groove closer to the light emitter constitutes the second inclined surface.

17. The proximity sensor of claim 16, wherein the second inclined surface is flat and slopes from a bottom of the second groove to the boundary surface toward the light emitter.

18. The proximity sensor of claim 17, wherein the second groove has a V-shaped or inverted trapezoidal cross section profile.

19. The proximity sensor of claim 16, wherein the second inclined surface is curved, concave and slopes from a bottom of the second groove to the boundary surface toward the light emitter.

20. The proximity sensor of claim 19, wherein the second groove has a U-shaped or hemispherical cross section profile.

21. The proximity sensor of claim 3, wherein the second crosstalk alleviator is a second stripe formed on the boundary surface and extending in a direction orthogonal to another direction which the light emitter and the light receiver are aligned along, and a surface of the second stripe closer to the light receiver constitutes the second inclined surface.

22. The proximity sensor of claim 21, wherein the second inclined surface is flat and slopes from a top of the second stripe to the boundary surface toward the light receiver.

23. The proximity sensor of claim 22, wherein the second stripe has a triangular or trapezoidal cross section profile.

24. The proximity sensor of claim 21, wherein the second inclined surface is curved, convex and slopes from a top of the second stripe to the boundary surface toward the light receiver.

25. The proximity sensor of claim 24, wherein the second stripe has an inverted U-shaped or hemispherical cross section profile.

26. The proximity sensor of claim 3, wherein a reflection index alleviator is disposed on the main surface of the substrate and between the light emitter and the light receiver.

27. The proximity sensor of claim 26, wherein the reflection index alleviator absorbs light emitted from the light emitter.

28. The proximity sensor of claim 27, wherein the reflection index alleviator is a coating in a predetermined color.

29. The proximity sensor of claim 26, wherein the reflection index alleviator is tiny bumps and dents formed on the main surface.

30. The proximity sensor of claim 1, wherein the light emitter is VCSEL (Vertical Cavity Surface Emitting Laser).

31. The proximity sensor of claim 1, wherein the light emitter is LED (light-emitting diode).

32. The proximity sensor of claim 31, wherein the light receiver is a photodiode.

33. An electronic device, comprising the proximity sensor of claim 1.

34. The electronic device of claim 33, wherein the electronic device comprises an optical window permeable for light emitted from the proximity sensor and light reflecting off a target object to propagate toward the proximity sensor.

35. The electronic device of claim 34, wherein the proximity sensor is disposed in a manner that the boundary surface of the resin faces an inner side of the optical window, wherein a light-blocking film is disposed on the optical window at a position between an area corresponding to the light emitter and an area corresponding to the light receiver.

36. The proximity sensor of claim 1, wherein the boundary surface comprises a portion connecting the first inclined surface and the second inclined surface, wherein the portion is flat.

* * * * *